(12) United States Patent  
Lin et al.

(10) Patent No.: US 9,375,874 B2  
(45) Date of Patent: Jun. 28, 2016

(54) ACCESSORY, ELECTRONIC ASSEMBLY, CONTROL METHOD, AND METHOD FOR FORMING AN ACCESSORY

(71) Applicant: HTC Corporation, Taoyuan County (TW)

(72) Inventors: Yen-Hung Lin, Taoyuan County (TW); Chien-Wei Hsieh, Taoyuan County (TW); Chun-Ta Huang, Taoyuan County (TW); Hung-Chuan Wen, Taoyuan County (TW); Michael Ross Massucco, San Francisco, CA (US)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 14/224,056

(22) Filed: Mar. 24, 2014

(65) Prior Publication Data  
US 2014/0205799 A1  Jul. 24, 2014

Related U.S. Application Data

(63) Continuation-in-part of application No. 14/094,799, filed on Dec. 3, 2013.

(60) Provisional application No. 61/932,780, filed on Jan. 29, 2014.

(51) Int. Cl.  
*G06F 3/14* (2006.01)  
*G02B 27/00* (2006.01)  
(Continued)

(52) U.S. Cl.  
CPC .............. *B29C 65/08* (2013.01); *G06F 1/1628* (2013.01); *A45C 2011/002* (2013.01); *A45C 2011/003* (2013.01); *B32B 3/266* (2013.01);  
(Continued)

(58) Field of Classification Search  
None  
See application file for complete search history.

(56) References Cited

U.S. PATENT DOCUMENTS 6,415,138 B2 * 7/2002 Sirola ................... G06F 1/1626  
345/173  
6,718,611 B1  4/2004 Lai  
(Continued)

FOREIGN PATENT DOCUMENTS

CN  301434890  1/2011  
CN  301636858  8/2011  
(Continued)

OTHER PUBLICATIONS

Machine Translation of JP 2005017356 A, Jan. 2005.*  
(Continued)

*Primary Examiner* — Jeff Vonch  
(74) *Attorney, Agent, or Firm* — Jianq Chyun IP Office

(57) ABSTRACT

An accessory suitable for an electronic device is provided. The electronic device has a display area. The accessory includes a coupling portion and a cover portion. The coupling portion is suitable to be coupled to the electronic device. The cover portion is connected to the coupling portion and is suitable for covering the display area of the electronic device. The cover portion has a plurality of light-transmitting areas, and the light-transmitting areas are arranged on the display area in an array. An image generated by the display area is projected out of the cover portion through the light-transmitting areas. Moreover, an electronic assembly containing the electronic device and the accessory is also provided. Furthermore, a control method is also provided for controlling the electronic assembly. A method is also provided for forming an accessory.

20 Claims, 18 Drawing Sheets

(51) Int. Cl.

| | | |
|---|---|---|
| *G02B 27/02* | (2006.01) | |
| *B32B 3/30* | (2006.01) | |
| *A45C 11/00* | (2006.01) | |
| *B29C 65/08* | (2006.01) | |
| *G06F 1/16* | (2006.01) | |
| *H04M 1/725* | (2006.01) | |
| *G06F 3/041* | (2006.01) | |
| *B32B 3/26* | (2006.01) | |

(52) U.S. Cl.
CPC ............... *G02B 27/00* (2013.01); *G02B 27/02* (2013.01); *G06F 3/0416* (2013.01); *G06F 3/14* (2013.01); *G06F 2200/163* (2013.01); *G06F 2200/1634* (2013.01); *H04M 1/72527* (2013.01); *H04M 1/72575* (2013.01); *Y10T 428/24331* (2015.01)

(56) References Cited

U.S. PATENT DOCUMENTS

| | | | |
|---|---|---|---|
| 6,790,396 B2* | 9/2004 | Eiden | B29C 45/14811 264/132 |
| D641,348 S* | 7/2011 | Kim | D14/250 |
| D656,929 S* | 4/2012 | Hsiung | D14/250 |
| D657,354 S | 4/2012 | Kim | |
| 2003/0148742 A1* | 8/2003 | Kim | A44C 23/00 455/566 |
| 2004/0058703 A1* | 3/2004 | Eromaki et al. | 455/550.1 |
| 2005/0286212 A1* | 12/2005 | Brignone et al. | 361/679 |
| 2006/0022954 A1* | 2/2006 | Berry | 345/173 |
| 2006/0289284 A1 | 12/2006 | Han | |
| 2007/0268202 A1* | 11/2007 | Lim et al. | 345/1.1 |
| 2008/0069384 A1* | 3/2008 | Kim et al. | 381/189 |
| 2008/0187716 A1* | 8/2008 | Yu | B29C 45/14811 428/138 |
| 2008/0280083 A1* | 11/2008 | Qiu et al. | 428/35.8 |
| 2008/0297989 A1* | 12/2008 | Wang | H04M 1/0283 361/600 |
| 2008/0302456 A1* | 12/2008 | Cook | A45C 11/00 150/154 |
| 2009/0126186 A1* | 5/2009 | Wu | H01H 13/704 29/622 |
| 2009/0261741 A1* | 10/2009 | Huang | G09G 3/14 315/169.3 |
| 2009/0326689 A1* | 12/2009 | Allard | G11B 19/022 700/94 |
| 2010/0008030 A1* | 1/2010 | Weber | C25D 11/16 361/679.02 |
| 2010/0078343 A1 | 4/2010 | Hoellwarth et al. | |
| 2010/0273530 A1 | 10/2010 | Jarvis et al. | |
| 2011/0045812 A1* | 2/2011 | Kim et al. | 455/418 |
| 2011/0063205 A1 | 3/2011 | Kufner | |
| 2011/0119973 A1* | 5/2011 | Andre | G09F 9/30 40/541 |
| 2011/0175748 A1* | 7/2011 | Small | G02B 6/0008 340/815.55 |
| 2011/0195224 A1* | 8/2011 | Zhang et al. | 428/138 |
| 2012/0071217 A1 | 3/2012 | Park | |
| 2012/0085679 A1* | 4/2012 | Kim | A45C 3/001 206/736 |
| 2012/0194448 A1 | 8/2012 | Rothkopf | |
| 2012/0212430 A1* | 8/2012 | Jung | G06F 1/1626 345/173 |
| 2012/0263936 A1* | 10/2012 | Krzyak et al. | 428/304.4 |
| 2012/0268891 A1* | 10/2012 | Cencioni | 361/679.55 |
| 2013/0027867 A1* | 1/2013 | Lauder et al. | 361/679.29 |
| 2013/0076614 A1 | 3/2013 | Ive et al. | |
| 2013/0094126 A1* | 4/2013 | Rappoport | G02B 27/01 361/679.01 |
| 2013/0147753 A1 | 6/2013 | Griffin | |
| 2013/0165190 A1* | 6/2013 | Ko | H05K 5/03 455/575.8 |
| 2013/0176241 A1 | 7/2013 | Byun et al. | |
| 2013/0300679 A1* | 11/2013 | Oh | A45C 11/00 345/173 |
| 2014/0159867 A1* | 6/2014 | Sartee et al. | 340/6.1 |
| 2014/0174846 A1* | 6/2014 | Molinaro | 181/177 |
| 2014/0185206 A1* | 7/2014 | Kim | H05K 5/0017 361/679.01 |
| 2014/0198070 A1* | 7/2014 | Won | G06F 3/017 345/173 |
| 2014/0204511 A1* | 7/2014 | Oh | G06F 1/1632 361/679.01 |
| 2014/0268517 A1* | 9/2014 | Moon | H05K 7/00 361/676.01 |
| 2014/0274214 A1* | 9/2014 | Kim | H04M 1/0266 455/566 |
| 2014/0274217 A1* | 9/2014 | Lee | H04M 1/0266 455/566 |
| 2014/0298062 A1* | 10/2014 | Lee | H05K 5/03 713/323 |
| 2014/0306553 A1* | 10/2014 | Lee | G06F 1/3231 307/326 |
| 2014/0333552 A1* | 11/2014 | Kang | G06F 3/03 345/173 |

FOREIGN PATENT DOCUMENTS

| | | | |
|---|---|---|---|
| CN | 201958003 | 9/2011 | |
| CN | 301872369 | 3/2012 | |
| CN | 302220043 | 12/2012 | |
| CN | 302225913 | 12/2012 | |
| CN | 302491894 S | 7/2013 | |
| CN | 302530249 | 8/2013 | |
| CN | 302655611 | 11/2013 | |
| CN | 302707016 | 1/2014 | |
| EP | 1860488 | 11/2007 | |
| EP | 002046607-0005 | 6/2012 | |
| EP | 2662746 | 11/2013 | |
| GB | 2297525 A * | 8/1996 | ............... B44F 1/063 |
| JP | 04135800 A * | 5/1992 | ............... B44F 1/06 |
| JP | 2004046517 A * | 2/2004 | |
| JP | 2005017356 A * | 1/2005 | ............... G09F 13/06 |
| JP | 2005202301 A * | 7/2005 | ............... G09F 9/00 |
| JP | 1406405 | 1/2011 | |
| JP | 2011066705 A * | 3/2011 | |
| KR | 30-0510296 | 10/2008 | |
| KR | 30-0647648 | 6/2012 | |
| KR | 30-0707696 | 9/2013 | |
| KR | 30-0718965 | 12/2013 | |
| TW | D138201 | 12/2010 | |
| TW | D145123 | 1/2012 | |
| TW | M421678 | 1/2012 | |
| TW | D135002 | 4/2013 | |
| TW | D152893 | 4/2013 | |
| TW | 201323915 | 6/2013 | |
| TW | M461292 | 9/2013 | |
| TW | D158992 | 2/2014 | |
| TW | D162739 | 9/2014 | |
| WO | WO 9013105 A1 * | 11/1990 | ............... G09F 13/06 |
| WO | WO 2008139388 A1 * | 11/2008 | ............... B44F 1/10 |
| WO | 2009145154 | 12/2009 | |

OTHER PUBLICATIONS

English Abstract for JP 04135800 A, May 1992.*
Machine Translation of JP 2005202301 A, Jul. 2005.*
"Office Action of Taiwan Counterpart Application", issued on Sep. 11, 2014, p. 1-p. 4.
"Office Action of Taiwan Counterpart Application", issued on Aug. 25, 2014, p. 1-p. 5.
"Office Action of Europe Counterpart Application", issued on Dec. 22, 2014, p. 1-p. 4.
"Search Report of Europe Application, Application No. 14175045.5-1959", issued on Jan. 7, 2015, p. 1-p. 4.
"Office Action of Europe Application, Application No. 14175045.5-1959", issued on Jan. 23, 2015, p. 1-p. 9.
Incase CL56250 Perforated Snap Case for iPod Touch 2G, http://www.amazon.com/dp/B002SK1EAA?_encoding=UTF8&camp=15041&creative=373501&linkCode=as3&tag=crazool-20, Incase Designs (Ref. 7).

(56) References Cited

OTHER PUBLICATIONS iPad Air case | Mesh Shell Case for iPad Air Mat Black | IRUAL | IRMSD500-MBK, http://www.amazon.com/iPad-SHELL-BLACK-IRUAL-IRMSD500-MBK/dp/B00GJIV3R6/ref=sr_1_3?s=electronics&ie=UTF8&qid=1423107499&sr=1-3&keywords=mesh+shell+case+for+ipad+air, IRUAL (Ref. 8).

Unboxing: GGMM Leather Flip Cover Case for iPhone5, Retrieved Dec. 24, 2012, from http://www.web.archive.org/web/20121224001918/http://www.macuknow.com/node/20575 (Ref. 13).

Mesh Shell Case for iPhone 5, Retrieved Mar. 27, 2015, from http://detail.1688.com/offer/1192700281.html?spm=0.0.0.0.tsfgGZ (Ref. 15).

LuLu, "Ordinary Price, Extraordinary Performance—Nokia 5800 XpressMusic", Nov. 30, 2008, available at: http://www.mobile01.com/topicdetail.php?f=122&t=854962 (Ref. 17).

"Notice of Allowance of TW Related Application," issued on Jul. 18, 2014, p. 1-p. 7.

"Notice of Allowance of JP Related Application," issued on Jan. 13, 2015, p. 1-p. 2.

"Grounds for Patent Invalidation of TW Related Application," issued on May 7, 2015, p. 1-p. 16.

"Evaluation Report of Design Patent of CN Related Application," issued on Oct. 17, 2014, with English translation thereof, p. 1-p. 28.

"Office Action of U.S. Appl. No. 14094799", issued on Aug. 13, 2015, p. 1-p. 34.

Office Action of European Counterpart Application, issued on Jan. 29, 2016, p. 1-p. 6.

\* cited by examiner

ACCESSORY, ELECTRONIC ASSEMBLY, CONTROL METHOD, AND METHOD FOR FORMING AN ACCESSORY

CROSS-REFERENCE TO RELATED APPLICATION

This application is a continuation-in-part application of and claims the priority benefit of a prior application Ser. No. 14/094,799, filed on Dec. 3, 2013, now pending. This application also claims the priority benefits of U.S. provisional application Ser. No. 61/932,780, filed on Jan. 29, 2014. The entirety of each of the above-mentioned patent applications is hereby incorporated by reference herein and made a part of this specification.

BACKGROUND OF THE INVENTION

1. Field of the Invention

The application is related to an accessory, and more particularly, to an accessory applied in an electronic device and a relevant control method.

2. Description of Related Art

Due to their diverse functions and thin design, tablet devices such as the smart phone and the tablet computer are very popular among consumers. As a result, relevant accessories are also vigorously developed. In particular, accessories such as the protective sleeve and the protective cover are most popular among consumers. One protective sleeve utilizes a wallet-style or a book-style design, and this type of protective sleeve may cover the display area (such as the touch display screen) of the tablet device through the cover body of the protective sleeve to avoid damage to the display area. Similarly, the protective cover also has a cover body to achieve similar protection. However, when receiving a notification, a user needs to open the cover body to be able to see the content of the notification in the display area. For instance, when receiving a call, the user needs to open the cover body to be able to see the caller in the display area to decide whether to answer the call. These issues all cause inconvenience in use.

SUMMARY OF THE INVENTION

The application is directed to an accessory for protecting an electronic device and projecting an image of a display area of the electronic device.

The application is directed to an electronic assembly. An accessory of the electronic assembly may project an image of a display area of the electronic device of the electronic assembly.

The application is directed to a control method for controlling an electronic device having a display area covered by a cover portion of an accessory.

The application provides an accessory suitable for an electronic device. The electronic device has a display area. The accessory includes a coupling portion and a cover portion. The coupling portion is suitable to be coupled to the electronic device. The cover portion is connected to the coupling portion and is suitable for covering the display area of the electronic device. The cover portion has a plurality of light-transmitting areas, and the light-transmitting areas are arranged on the display area in an array. An image generated by the display area is projected out of the cover portion through the light-transmitting areas.

The application provides an electronic assembly including an electronic device and an accessory. The electronic device has a display, a touch sensor, and a processing unit forming a display area. The touch sensor is overlapped with the display. The processing unit is coupled to the touch sensor and the display. The accessory includes a coupling portion and a cover portion. The coupling portion is suitable to be coupled to the electronic device. The cover portion is connected to the coupling portion and is suitable for covering the display area of the electronic device. The cover portion has a plurality of light-transmitting areas, and the light-transmitting areas are arranged on the display area in an array. An image generated by the display area is projected out of the cover portion through the light-transmitting areas.

The application provides a control method. The control method is suitable for controlling an electronic assembly. The electronic assembly includes an electronic device and an accessory. The electronic device has a display area. The accessory has a cover portion for covering the display area of the electronic device. The cover portion has a plurality of light-transmitting areas. The light-transmitting areas are arranged on the display area in an array. The control method includes the following steps. An event is received through the electronic device. Next, an image is generated through the display area according to the event, and the image generated by the display area is projected out of the cover portion through the light-transmitting areas.

Based on the above, in the application, a plurality of light-transmitting areas arranged in an array, a matrix or a dot matrix are formed on a cover portion of an accessory. The plurality of light-transmitting areas are arranged in an array, and configured for an image generated by the display area to be projected out of the cover portion to form a dotted character, a dotted symbol, or a dotted pattern. When the cover portion covers the display area of the electronic device, the image of the display area may still be projected out of the cover portion through the light-transmitting areas of the cover portion. The image projected out of the cover portion may form a dot matrix pattern of text, number or image. The image projected out of the cover portion may form lattice pattern of text, number, symbol or image. Therefore, a user may still view the image displayed in the display area through the light-transmitting areas of the cover portion without opening or moving the cover portion. Moreover, a high-resolution image may be displayed in the display area not covered by the cover portion, and the display area covered by the cover portion may display a low-resolution image according to the density of the light-transmitting areas. Moreover, in the application, the electronic device is controlled under such hardware settings by corresponding to an event received by the electronic device to achieve diverse applications.

To make the above features and advantages of the application more comprehensible, several embodiments accompanied with drawings are described in detail as follows.

DETAILED DESCRIPTION OF DISCLOSED EMBODIMENTS

Figure 1:
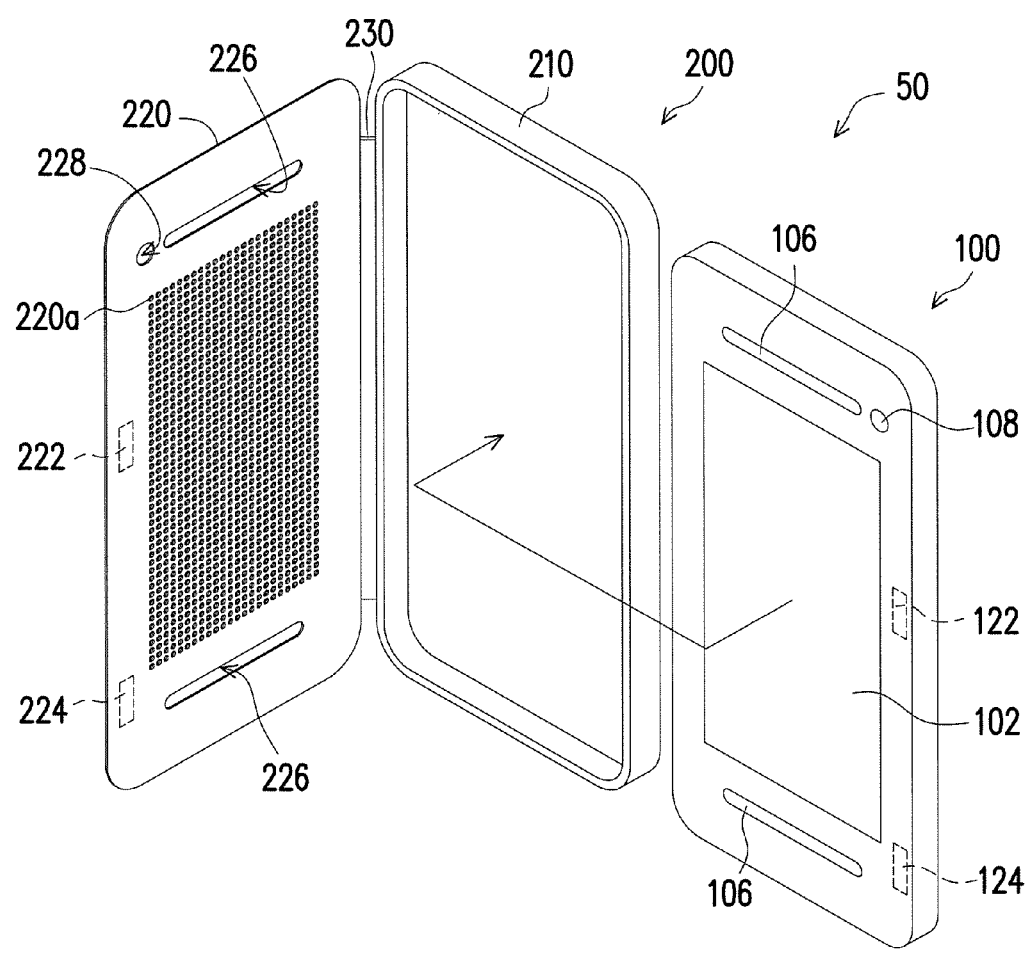
FIG. 1 is a schematic view of an electronic assembly of an embodiment of the application before assembly.
Figure 2:
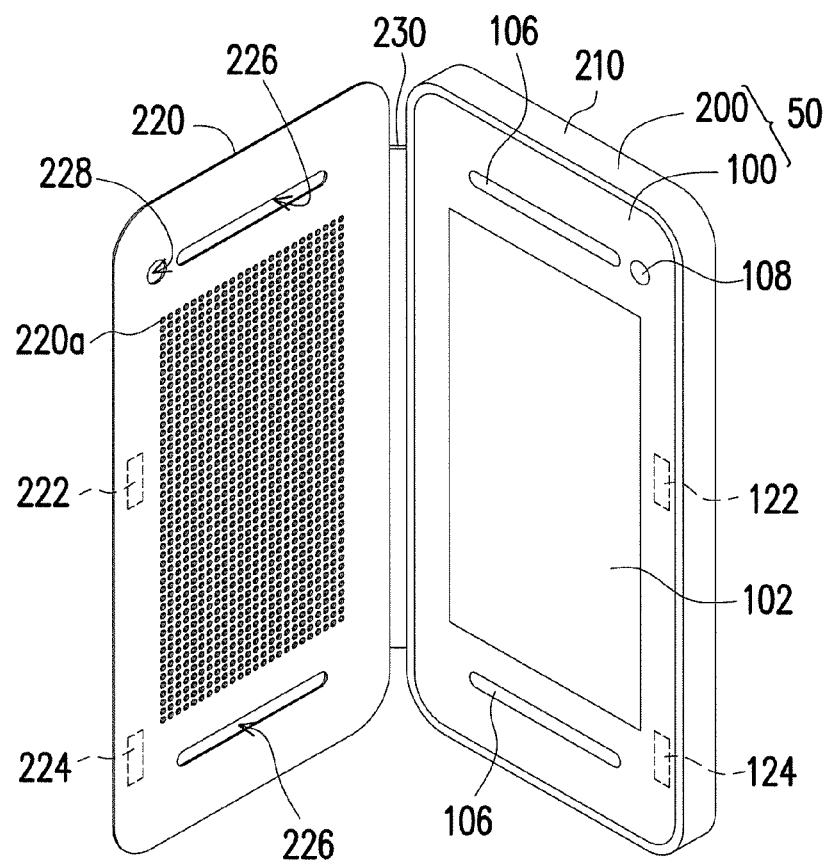
FIG. 2 is a schematic view of the electronic assembly of FIG. 1 after assembly.
Figure 3:
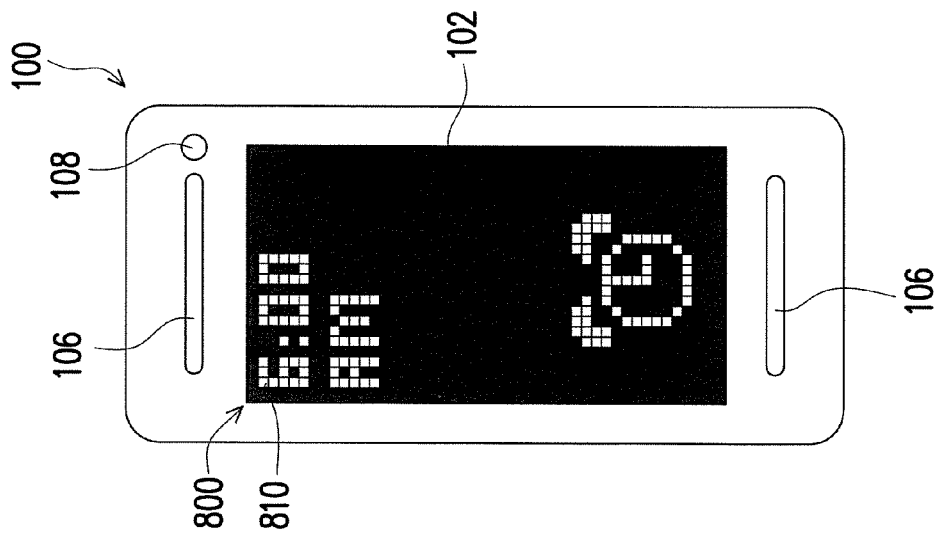
FIG. 3 is a front view of the electronic device of FIG. 1.

Referring to FIG. 1, FIG. 2, and FIG. 3, an electronic assembly 50 of the present embodiment includes an electronic device 100 and an accessory 200 applied in the electron device 100. The accessory may be a cover that may be flip open or slide open. In the present embodiment, the electronic device 100 may be a smart phone, PDA, tablet PC, notebook or any kind of electronic device having a display. However, in other embodiments not shown, the electron device 100 may also be a tablet computer or a similar tablet device. The electronic device 100 has a display area 102. The display area 102 may be used to display an image such as a liquid crystal display (LCD) display, electronic ink display or an organic light-emitting diode (OLED) display, and the display area 102 may be an entire display or a portion of a display. The display area 102 is used to display user interface, graphic, image or figures. The electronic device 100 may further comprise a touch sensor overlapping the display area so a user may interact with the user interface, graphic or figures directly by using or touching the touch sensor. The accessory 200 includes a coupling portion 210, a cover portion 220, and a flexible portion 230. The coupling portion 210 is suitable to be coupled to the electronic device 100. The cover portion 220 is connected or coupled to the coupling portion 210 and is suitable for covering the display area 102 of the electronic device 100. The flexible portion 230 connects between the cover portion 220 and the coupling portion 210. In particular, the location of the cover portion 220 relative to the coupling portion 210 may be changed by bending the flexible portion 230 to decide whether to cover the display area 102 of the electronic device 100. The flexible portion 230 and the cover portion 220 may be formed as one by mold injection process or any process that form the flexible portion 230 and the cover portion 220 as one piece. The coupling portion 210 may be coupled to the electronic device 100 at four corner of the electronic device 100 for securing the coupling portion 210 on the electronic device 100. The cover portion 220 and coupling portion 210 may be made by different type of material which has different flexibility. The flexible portion 230 may retain a curve shape that may restore to its curve shape after a force is applied. The cover portion 220 may cover the display area 102 when the flexible portion 230 in its original shape. The force is applied on the cover portion 220 in result change the shape of the flexible portion 230 so that the cover portion 220 is not cover the display area 102.

Figure 7:
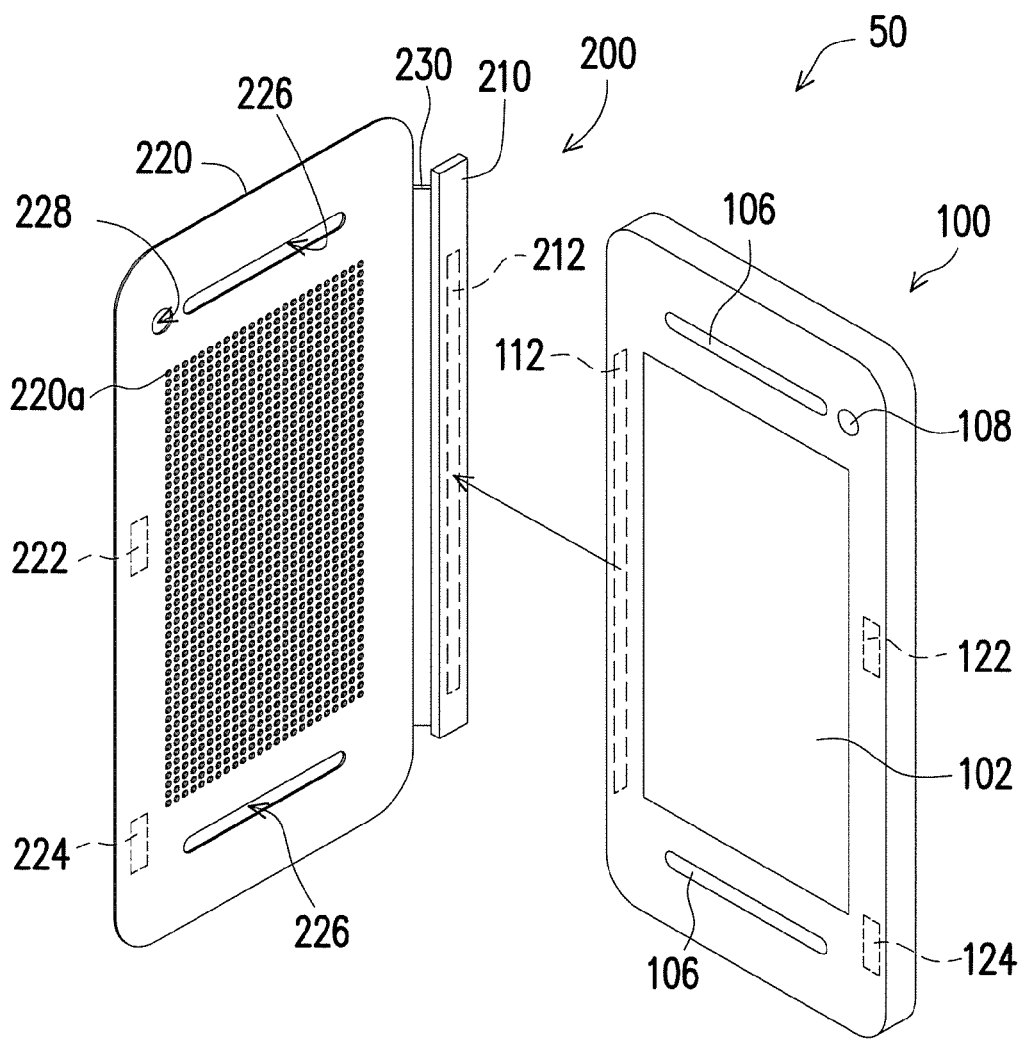
FIG. 7 is a schematic view of an electronic assembly of another embodiment of the application before assembly.

Referring to FIG. 1 and FIG. 2, in order to couple the coupling portion 210 to the electronic device 100 to fix the location of the coupling portion 210 relative to the electronic device 100, the coupling portion 210 is concave and is suitable for structurally covering the outside and the bottom of the electronic device 100, so as to fix the location of the coupling portion 210 relative to the electronic device 100. Moreover, in another embodiment, as shown in FIG. 7, the electronic device 100 has a magnetic coupling member 112, the coupling portion 210 has another magnetic coupling member 212, and the magnetic coupling member 112 and the magnetic coupling member 212 are suitable to be magnetically attracted to each other. The magnetic coupling member 112 and the magnetic coupling member 212 may be a combination of a pair of permanent magnetic members or a combination of a permanent magnetic member and a magnetic sensing portion.

Referring further to FIG. 1 and FIG. 2, to fix the location of the cover portion 220 relative to the display area 102, the electronic device 100 has a magnetic attachment member 122, the cover portion 220 has another magnetic attachment member 222, and the magnetic attachment member 122 and the magnetic attachment 222 are suitable to be magnetically attracted to each other. The magnetic attachment member 122 and the magnetic attachment member 222 may be a combination of a pair of permanent magnetic members or a combination of a permanent magnetic member and a magnetic sensing portion.

Referring further to FIG. 1 and FIG. 2, to determine whether the cover portion 200 covers the display area 102, the electronic device 100 has a sensor 124, the cover portion 200 has a first element 224, and whether the sensor 124 senses the first element 224 determines whether the cover portion 200 covers the display area 102. In the present embodiment, the sensor 224 may be a sensor that senses the magnetic field, electric field, force or light such as a magnetic sensor, a Hall effect sensor, a hall sensor, pressure sensor, or light sensor, and the first element 224 may be an element that generate magnetic field, electric field, light or force such as a permanent magnet, electronic magnet, LED light, dead weight, or magnetic test member. The first element may be an active element which generates a wireless signal. The wireless signal may be coded or having a determined frequency. The wireless signal is detected by the sensor 224 to determine the cover portion covering the display area. The received wireless signal may be verified by processing unit of the electronic device so that an image to be displayed on the display area for the cover portion. In another embodiment not shown, the magnetic attachment member 222 and the first element 224 may be a single magnetic member. The sensor 124 may sense the magnetic polarity, characteristic of the magnetic field, such as direction of the magnetic field or magnetic flux or magnetic field of the first element. Therefore, according to the location and/or the magnetic polarity of the first element 224 that is sensed by the sensor 224, the electronic device 100 may identify the appearance type of the accessory 200 and adjusts the properties of an image output by the display area 102. For example, when the accessory 200 of red color is sensed, a character, a symbol, or a picture of the image is shown in red color on the display area 102. For another example, when the accessory 200 of one color (such as red) is sensed, a character, a symbol, or a picture of the image is shown in the contrasting/complementary color of the one color (such as green) on the display area 102. When the sensor 124 senses the first element 224 having or generating a first direction of magnetic field, the electronic device 100 determines to display a first image on the display area 102. When the sensor 124 senses the first element 224 having a second direction of magnetic field, the electronic device 100 determines to display a second image on the display area 102. The first image has different image characteristic, such as brightness, color contrast, color, hue, tint, shade, tone, saturation, chroma, luminosity, grayscale, or combination of the above, then the second image. Another example of the sensor and the first element is disclosed as follow. The electronic device 100 may have a plurality of sensor 124 disposed in various place on the electronic device 100. The cover portion may has a plurality of first element 224 disposed on the cover portion. The plurality of sensor 124 senses the plurality of first elements 224. Each plurality of sensor 124 may sense a least one of the plurality of first element 224. The plurality of sensor 124 sense a combination of the magnetic field according the magnetic field of the each plurality of first elements 224. When the plurality of sensors 124 senses the plurality of first elements 224 having a first combination of magnetic field, the electronic device 100 determines to display a first image on the display area 102. When the plurality of sensors 124 senses the plurality of first elements 224 having a second combination of magnetic field, the electronic device 100 determines to display a second image on the display area 102.

Referring further to FIG. 1 and FIG. 2, the electronic device 100 has a pair of audio output areas 106 (such as two sets of speaker holes) located on two opposite sides of the display area 102, the cover portion 220 covers the pair of audio output areas 106, the cover portion 220 has a pair of audio output holes 226, and the pair of audio output holes 226 respectively expose the pair of audio output areas 106. Moreover, the electronic device has a third sensor for detecting a presence of nearby objects, and the cover portion has an opening for the third sensor to detect the presence of nearby objects via the opening of the cover portion. For example, the electronic device has a distance sensing area 108 (for instance, the distance sensor of the electronic device 100 is in the window on the case), the cover portion 220 covers the distance sensing area 108, the cover portion 220 has a distance sensing hole 228, and the distance sensing hole 228 exposes the distance sensing area 108.

Figure 5:
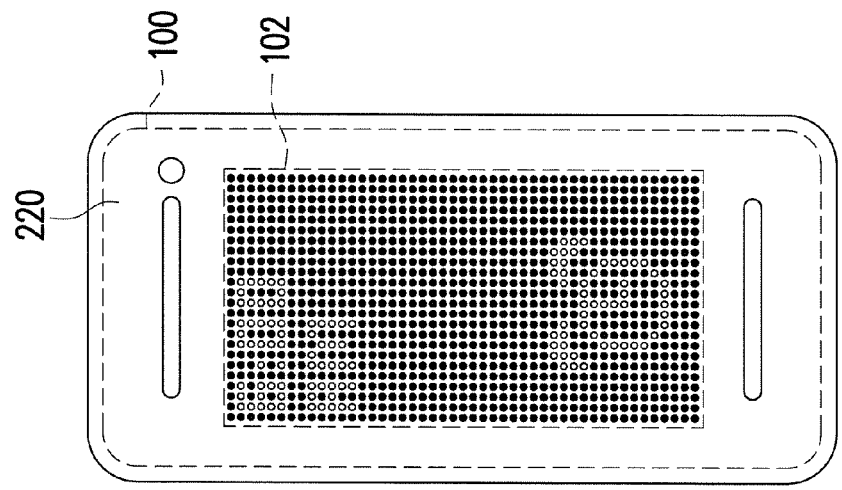
FIG. 5 is a front view of the cover portion of the accessory of FIG. 1 covering the display area of the electronic device.
Figure 4:
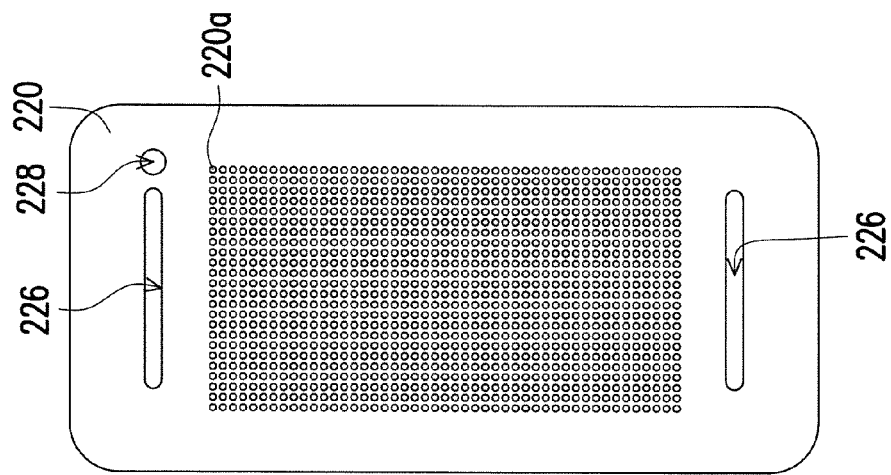
FIG. 4 is a front view of the cover portion of the accessory of FIG. 1.

Referring to FIG. 4 and FIG. 5, the cover portion 220 has a plurality of light-transmitting area 220a. The plurality of light-transmitting areas 220a are arranged on the display area 102 in an array, a matrix or lattice, and an image generated by the display area 102 is suitable to be projected out of the cover portion 220 through the light-transmitting areas 220a to be viewed by the user. When the image projected out of the plurality of the light-transmitting areas, the light from the display area resulting from the image displayed on the display area transmits through at least one of the plurality of light transmitting areas and the plurality of the light transmitting areas with no light transmitted through and the plurality of the light transmitting areas with light transmitted through form a representation of at least a character, a symbol or the image. The plurality of light-transmitting areas are arranged in an array, and configured for an image generated by the display area to be projected out of the cover portion to form a dotted character, a dotted symbol, or a dotted pattern. The light-transmitting area 220a may be a ditch, through hole that light may transmit through, or an area that light may transmit through. The plurality of light-transmitting area 220a may be arranged in row and column to form a matrix or array. Each row or column of light-transmitting area 220a may have different area or height. The adjacent row or column of light-transmitting area 220a may have different area or height. The plurality of light-transmitting area 220a may arrange to form a pattern or shape. Therefore, when a call or a notification is received, the user does not need to open the cover portion 220, and may directly view the image generated by the display area 102 from the light-transmitting areas 220a of the cover portion 220. The image projected out of the cover portion 220 may form a dot matrix pattern of text, number or image. The image projected out of the cover portion 220 may form lattice pattern of text, number or image. Moreover, the touch sensitivity of the display area 102 may be manually or automatically increased. The display area 102 is an area on the display or touch display. The touch display has a touch panel disposed on the display. The change of the touch sensitivity of the display area 102 is the change of the touch sensitivity of the touch panel. The touch sensitivity of the touch panel may be increased by changing the frequency of charging the touch panel or increasing the voltage or current applied to the touch panel. Therefore, the user may perform a touch operation or a gesture operation on the display area 102 via the cover portion 220. The touch operation or the gesture operation may be sensed by the touch panel. The array may be, for instance, a linear array, a triangular array, a square array, a rectangular array, a pentagonal array, a hexagonal array, or a polygonal array. When the electronic device 100 generates an event or receiving an event to display information on the display are and the sensor 124 senses the first element 224 indicated that the covering portion 220 is disposed or moved to cover the display area 102, the electronic device 100 may change the touch sensitivity of the touch panel so the touch panel may sense the touch gesture on the covering portion 220.

Figure 6:
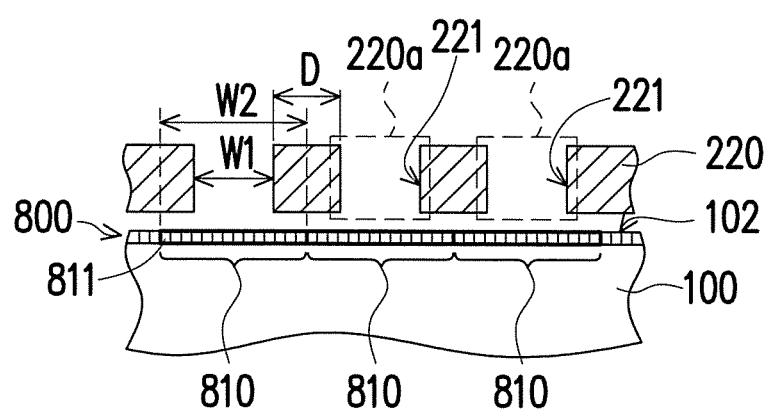
FIG. 6 is a partial cross-sectional view of the cover portion of the accessory of FIG. 1 overlapped with the display area of the electronic device.

Referring to FIG. 3, FIG. 5, and FIG. 6, in the present embodiment, the cover portion 220 has a plurality of through-holes 221 to form the light-transmitting areas 220a. Moreover, an image 800 output by the display area 102 contains a plurality of blocks 810, the blocks 810 respectively correspond to the light-transmitting areas 220a, and each of the blocks 810 further contains a plurality of pixels 811. Specifically, the pixels 811 refer to minimum pixels located in the display area 102 (such as a display screen) capable of generating an image, and the blocks 810 may be a pixel array formed by the plurality of pixels 811. Therefore, as shown in FIG. 3, a character, a symbol, or a picture, that is meaningful to the users, may be pieced together through the blocks 810, and the pixels 811 of the same block 810 may still display color gradient. In the present embodiment, a maximum width W1 of each of the light-transmitting areas 220a may be less than 3 millimeters to project an image with enough resolution. A high-resolution image may be displayed in the display area 102 not covered by the cover portion 220, and the display area 102 covered by the cover portion 220 may display a low-resolution image according to the density of the light-transmitting areas 220a.

Referring to FIG. 5 and FIG. 6, in the present embodiment, a minimum width W2 of each of the blocks 810 is greater than the maximum width W1 of each of the corresponding light-transmitting areas 220a. Therefore, when the cover portion 220 is not completely aligned with the display area 102 of the electronic device 100, the blocks 810 may still be projected out of the cover portion 220 through the corresponding light-transmitting areas 220a. Moreover, the minimum width W2 of each of the blocks 810 is greater than a shortest distance D between any two adjacent light-transmitting areas 220a to prevent the blocks 810 from being completely shielded by an opaque portion of the cover portion 220.

Figure 8:
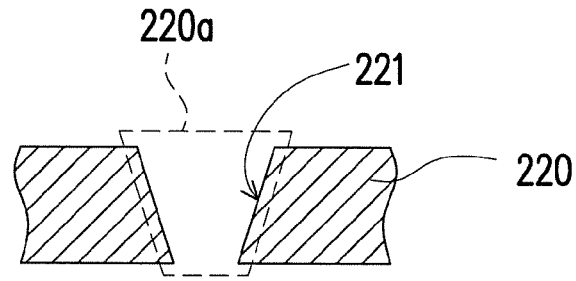
FIG. 8 is a cross-sectional view of a cover portion of an accessory of another embodiment of the application.
Figure 9:
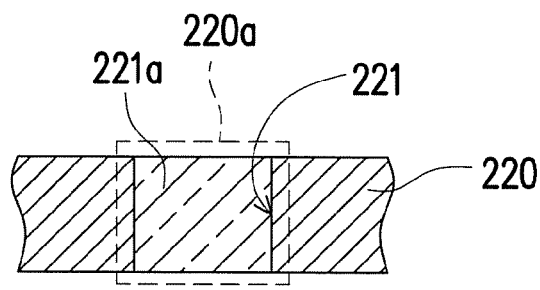
FIG. 9 is a cross-sectional view of a cover portion of an accessory of another embodiment of the application.
Figure 10:
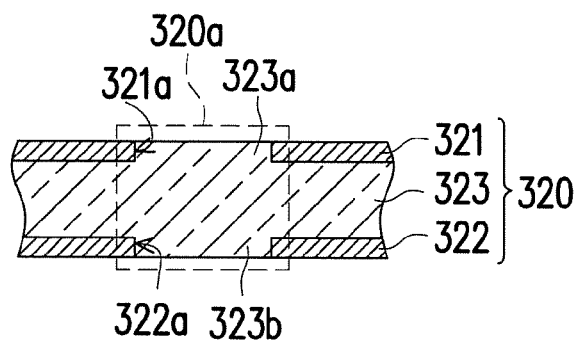
FIG. 10 is a cross-sectional view of a cover portion of an accessory of another embodiment of the application.

Referring to FIG. 8, in comparison to the column through-holes 221 in FIG. 6 that may limit the viewing angle of the user, the through-holes 221 of FIG. 8 have a truncated pyramid shape and may increase the viewing angle of the user. Moreover, referring to FIG. 9, in comparison to the light-transmitting areas 220a in FIG. 6 formed by the through-holes 221, the cover portion 220 of FIG. 9 further includes a plurality of light-transmitting bodies 221a. The light-transmitting bodies 221a are respectively located inside the through-holes 221 to form the light-transmitting areas 220a. Moreover, referring to FIG. 10, different from the cover portion 220 of FIGS. 6, 7, and 8, a cover portion 320 of FIG. 10 has a first opaque layer 321, a second opaque layer 322, and a light-transmitting layer 323 disposed between the first opaque layer 321 and the second opaque layer 322. The first opaque layer 321 has a plurality of first openings 321a, the second opaque layer 322 has a plurality of second openings 322a, and the first openings 321a are respectively aligned with the second openings 322a to form light-transmitting areas 320a. In the present embodiment, the light-transmitting layer 323 has a plurality of first columns 323a and a plurality of second columns 323b. The first columns 323a are respectively extended to the first openings 321a and the second columns 323b are respectively extended to the second openings 322a.

Figure 11:
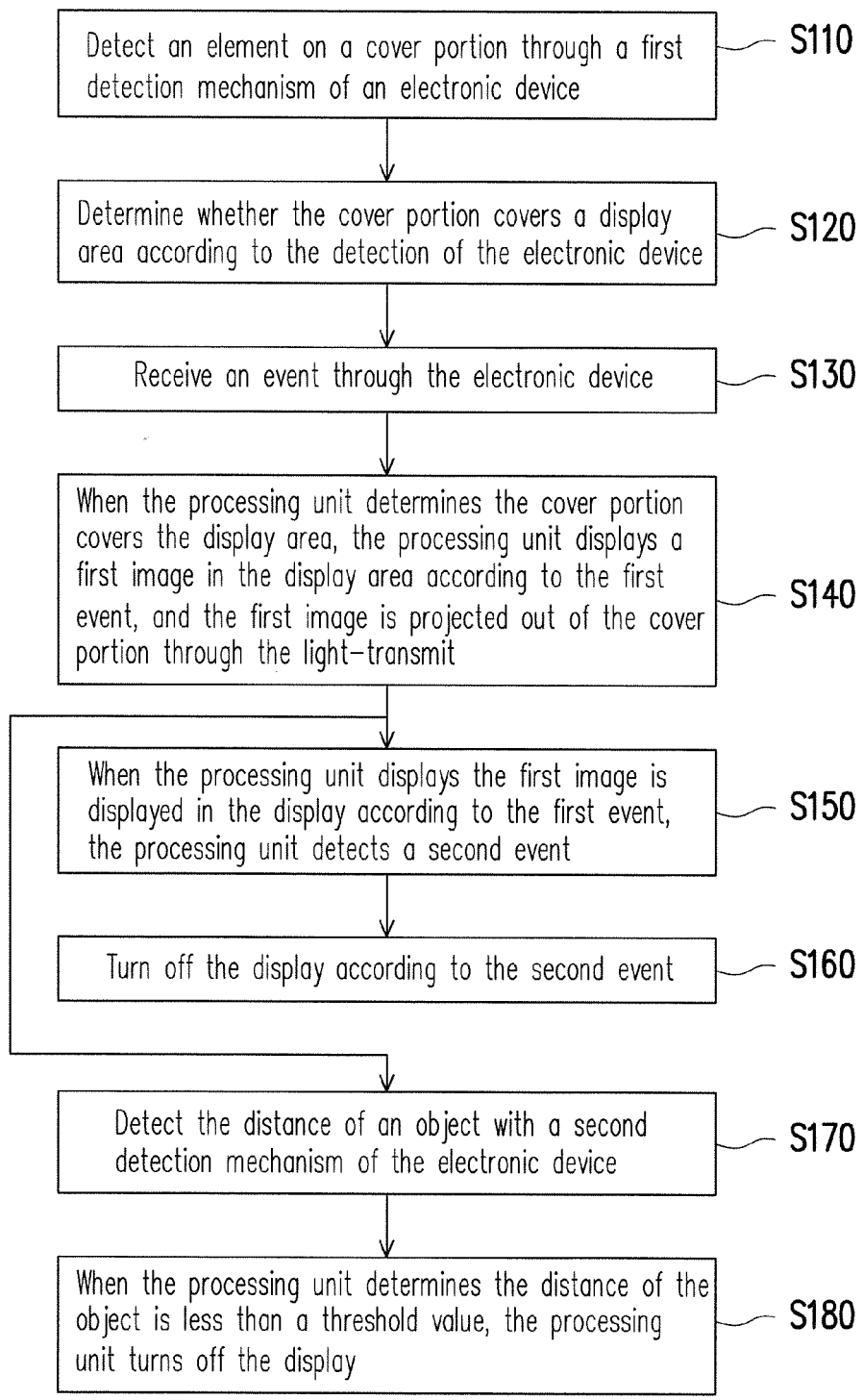
FIG. 11 is a flow chart of a control method of another embodiment of the application.
Figure 12:
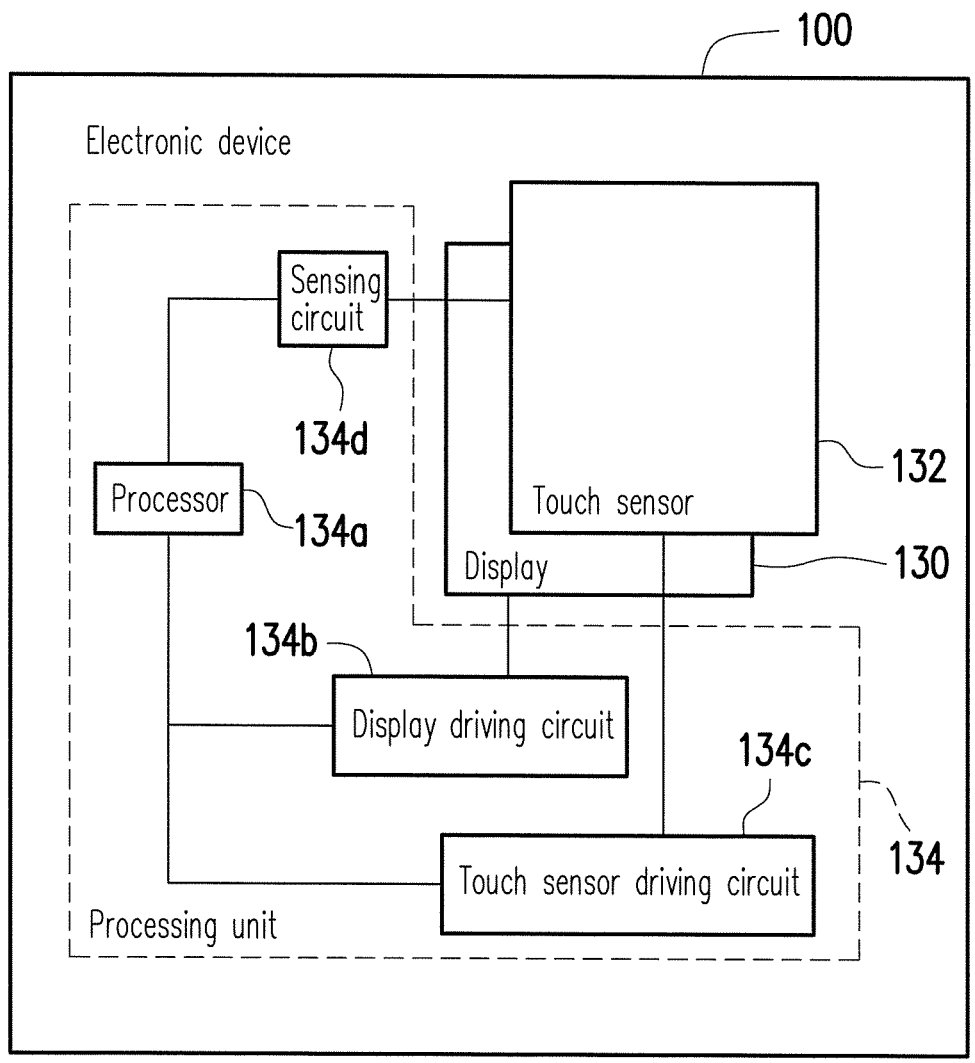
FIG. 12 is a circuit block diagram of the electronic device of FIG. 1.

Referring to FIG. 11 and FIG. 12, the control method of the present embodiment is suitable for controlling the electronic assembly 50 of FIG. 1. In particular, FIG. 12 illustrates a circuit block diagram of the electronic device 100 of the electronic assembly 50. In the present embodiment, the electronic device 100 has a display 130, a touch sensor 132, and a processor 134 forming the display area 102. The touch sensor 132 is overlapped with the display 130. The processing unit 134 is coupled to the display 130 and the touch sensor 132.

In the present embodiment, the processing unit 134 includes a processor 134a, a display driving circuit 134b, a touch sensor driving circuit 134c, and a sensing circuit 134d. The display driving circuit 134b is coupled to the display 130 and the processor 134a and drives the display 130 according to a command of the processor 132a. The touch sensor driving circuit 134c is coupled to the touch sensor 132 and the processor 134a and drives the touch sensor 132 according to the command of the processor 132a. The sensing circuit 134d is coupled to the touch sensor 132 and the processor 134a and sends the sensing result of the touch sensor 132 to the processor 132a.

Referring to FIG. 3, FIG. 5, FIG. 11, and FIG. 12, first, as shown in step S110, the method may be generally carried out by performing at least the following operations: detecting the passive information of the first element by a detection mechanism in the electronic device, determining the accessory device information based upon the detecting, and altering the operating state of the electronic device in accordance with the accessory device information. A detection mechanism detects the presence of the first element only when the cover portion is in proximity to the display. The detection mechanism may be a touch sensor, a magnet field sensor, a hull sensor, a pressure sensor, a switch, a light sensor, or capacitive sensor. The first element may be an active element that generates an information or energy such as magnetic field. The first element may be a passive element that is trigger by the sensor and change the property of the sensor. Please refer to the following for more detail. A first element 224 on the cover portion 220 is detected through a first detection mechanism of the electronic device 100 such as the sensing function of a sensor 124. Then, as shown in step S120, whether the cover portion 220 covers the display area 102 and the appearance type of the accessory 200 (such as the color of the accessory 200) is determined through the detection of the electronic device 100. The electronic device 100 may have a computer readable medium which includes at least computer code for detecting the passive information of the first element by a detection mechanism in the electronic device, computer code for determining accessory information based upon the detecting of the passive information of the first element, and computer code for altering the operating state of the electronic device in accordance with the accessory information. The detection mechanism provides the accessory information to the processor unit. The processor unit uses the accessory information to alter an operating state of the electronic device. Generally, the detection occurs only when the cover portion and the display are in close proximity to each other. Therefore, the processing unit determines a characteristic of at least one element on the cover portion with a first detection mechanism of the electronic device, when the cover portion covers the display area and displays an image on the display area according to the determined characteristic, wherein when the image being projected out of the cover portion through the plurality of light-transmitting areas. The plurality of light-transmitting areas represents at least a character, a symbol or the image. The characteristic of the element may be direction of the magnetic field, magnetic polarity, and characteristic of the magnetic field, such as direction of the magnetic field or magnetic flux or magnetic field of the element.

As shown in step S130, an event is received through the electronic device 100. The event includes the pressing of a key (such as a power key) of the electronic device 100, the touching of the display area 102 of the electronic device 100, the covering of the display area 102 of the electronic device 100 by the cover portion 220 of the accessory 200, or the electronic device 100 receiving a notification. The notification is, for instance, a caller ID, an alarm alert, a new message, or a new mail.

Then, as shown in step S140, when the processing unit 134 determines the cover portion 220 covers the display area 102, the processing unit 134 displays an image on the display area 102 according to the first event, and the image is projected out of the cover portion 220 through the light-transmitting areas 220a. Alternatively, when the processing unit 134 determines the cover portion 220 covers the display area 102, the processing unit 134 turns off the display 130. In the present embodiment, in step S140, when the processing unit 134 determines the cover portion 220 covers the display area 102, the touch sensitivity of the touch sensor 132 is increased. When the touch sensitivity of the touch sensor 132 is increased, the user may perform a touch operation or a gesture operation on the touch sensor 132 with the cover portion 220 in between.

Moreover, as shown in step S150, when the processing unit 134 displays the image on the display 130 according to the first event, the processing unit 134 detects a second event. The second event includes the pressing of a key (such as a power key) or another key of the electronic device 100, or the image displayed in the display area 102 displaying a preset time when the touch sensor 132 is not touched. Then, as shown in step S160, the display 130 is turned off according to the second event. Moreover, as shown in step S170, the distance of an object is detected with a second detection mechanism of the electronic device 100. For instance, the distance sensor 108 may be used to sense whether the head of the user is close. Then, as shown in step S180, when the processing unit 134 determines the distance of the object is less than a threshold value, the processing unit 134 turns off the display 130.

In step S150, the image 800, applied here and shown in FIG. 3, also contains a plurality of blocks 810, the plurality of blocks 810 respectively correspond to the plurality of light-transmitting areas 220a, each of the blocks 800 contains a plurality of pixels 811 shown in FIG. 6, the plurality of blocks 810 pieces a character, a symbol, or a picture, shown in FIG. 5, that is meaningful to a user. Besides, the properties of the image 800 are varied according to the appearance type of the accessory 200. For example, when the accessory 200 of red color is sensed, a character, a symbol, or a picture, pieced by the blocks 810 of the image 800, is shown in red color on the display area 102. For another example, when the accessory 200 of one color (such as red) is sensed, a character, a symbol, or a picture, pieced by the blocks 810 of the image 800, is shown in the contrasting/complementary color of the one color (such as green) on the display area 102.

The following refers to the electronic assembly and the control method of the embodiments above and presents usage variations in a plurality of different conditions.

In an OFF state (the display is turned off), the power key may be pressed to wake the display and enter a clock interface. When the cover portion of the accessory is removed from the display, the display displays a lock screen. The volume key and the touch sensor do not have an effect.

In a clock face state (the clock interface state), the power key may be pressed to make the system enter a sleep state. The ringer volume may be adjusted by pressing the volume key. The touch sensor may sense lateral sliding to display the next prompt. When the cover portion of the accessory is removed from the display, the display is awakened to the most recent application screen. When still not touched after the preset time (such as 3 seconds), the system enters the sleep state.

When the clock face is in the state of just closed case (the clock interface state when the display is covered by the cover portion), the power key may be pressed to make the system enter the sleep state. The ringer volume may be adjusted by pressing the volume key. The touch sensor may sense traverse sliding to display the next prompt. When the cover portion of the accessory is removed from the display, the display is awakened to the nearest program screen. When not touched after the preset time (such as 3 seconds), the system enters the sleep state.

In an alert state, the power key may be pressed to dismiss an alert and enter the sleep state. The volume key may be pressed to mute the alert. The cover portion of the accessory is brought close to the distance sensor to dismiss the alert. When the cover portion of the accessory is removed from the display, the display displays the lock screen and an alert user interface. When the alert is dismissed longer than the preset predetermined time (such as 3 seconds), the system enters the sleep state.

In a notification state (such as the notification of an SMS and or an e-mail), the power key may be pressed to dismiss the alert and enter the sleep state. The ringer volume may be adjusted by pressing the volume key. The cover portion of the accessory is brought close to the distance sensor to dismiss the notification. When the cover portion of the accessory is removed from the display, the display displays a program showing a notification to the most recent notification; alternatively, the display is directly unlocked and enters the program. When the notification is not unlocked after the preset time (such as 8 seconds), the system enters the sleep state.

In an incoming call state, the power key may be pressed to dismiss an incoming call. The volume key may be pressed to mute the ringer. The touch sensor may sense a sliding-up to receive a call; the cover portion of the accessory is brought close to the distance sensor to mute the ringer. When the cover portion of the accessory is removed from the display, the call is answered and an answering screen is displayed. When the caller is disconnected longer than the preset time (such as 3 seconds), the system directly enters the sleep state without dismissing the command.

In an in call state, the power key may be pressed to turn off the screen. The call volume may be adjusted by pressing the volume key. The touch sensor does not have an effect. When the cover portion of the accessory is removed from the display, an in call screen is displayed. If the command is not dismissed after the preset time (such as 3-5 seconds), then the screen is turned off.

In an in call and screen off state, the power key may be pressed to display an in call screen. The call volume may be adjusted by pressing the volume key. The touch sensor does not have an effect. When the cover portion of the accessory is removed from the display, the in call screen is displayed.

Based on the above, in the application, a plurality of light-transmitting areas is arranged in an array are formed on a cover portion of an accessory. When the cover portion covers a display area of an electronic device, an image of the display area may still be projected out of the cover portion through the light-transmitting areas of the cover portion. Therefore, a user may still view the image displayed in the display area through the light-transmitting areas of the cover portion without opening or moving the cover portion. Moreover, a high-resolution image may be displayed in the display area not covered by the cover portion, and the display area covered by the cover portion may display a low-resolution image according to the density of the light-transmitting areas. Moreover, in the application, the electronic device is controlled under such hardware settings by corresponding to an event received by the electronic device to achieve diverse applications.

Figure 13:
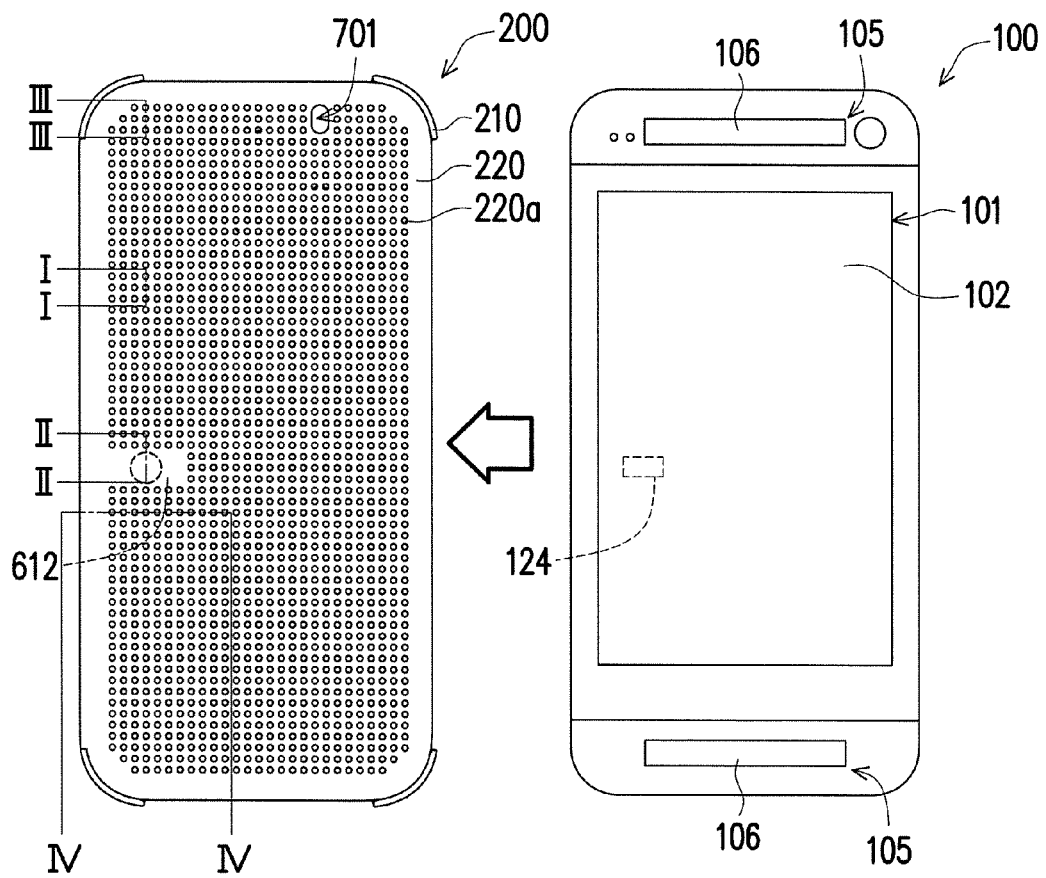
FIG. 13 is a front view of an electronic assembly of another embodiment of the application before assembly.

Referring to FIGS. 3, 4, 5 and 13, for another embodiment of the present application, the electronic device 100 in FIG. 13 may have a display 101, having a display area 102, and at least one speaker 105, having audio output areas 106, disposed adjacent to the display 101. The cover portion 220 has a plurality of light-transmitting areas 220a, and the light-transmitting areas 220a are arranged on the display area 102 in an array. An image generated by the display area 102 is projected out of the cover portion 220 through the light-transmitting areas 220a. The electronic device 100 may be placed under the cover portion 220 or inside the accessory 200. The display 101 may generate an image. The image projected out of the cover portion 220 may form a dot matrix pattern or lattice of text, number or image.

Figure 14:
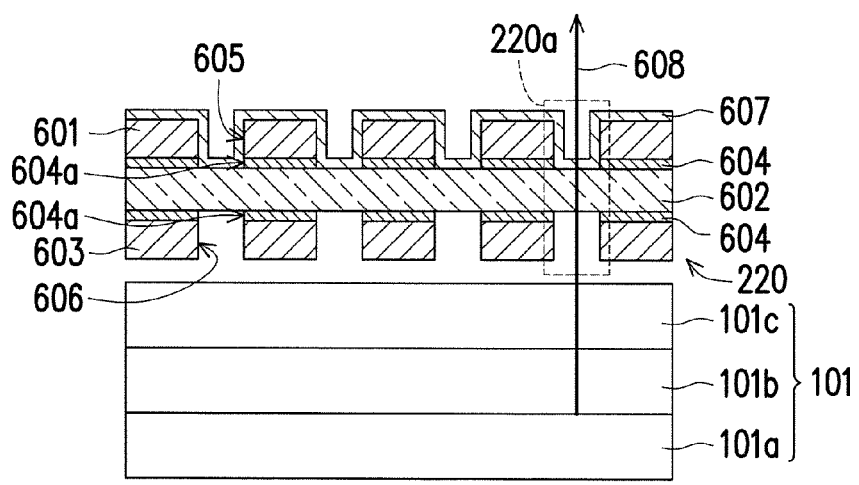
FIG. 14 is a cross-sectional view of the cover portion of the accessory and the electronic device in FIG. 13 taken along line I-I.
Figure 15:
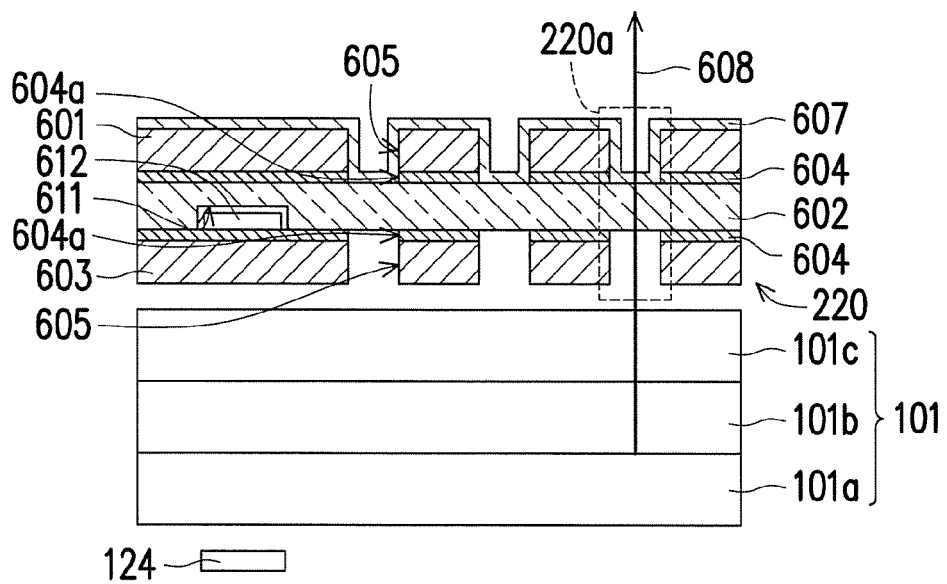
FIG. 15 is a cross-sectional view of the cover portion of the accessory and the electronic device in FIG. 13 taken along line II-II.

Referring to FIGS. 14 and 15, the cover portion 220 may be made out of stacking structure. The cover portion 220 or the structure has three layers. For the portion covering the display area 102, the cover portion 220 includes a transparent layer 602, a first layer 601 disposed on one side of the transparent layer 602 and a second layer 603 disposed on the other side of the transparent layer 602. The plurality of light-transmitting areas is arranged in an array and overlapping with the transparent layer. The first layer 601 has a plurality of first apertures 605, such as openings, cavities, windows or holes. The second layer 603 has a plurality of second apertures 606, such as openings, cavities, windows or holes. Each of the plurality of first apertures 605 of the first layer 601 corresponds to one of the plurality of second apertures 606 of the second layer 603. When an image displayed in the display area is projected out of the cover portion via the plurality of light-transmitting areas and the transparent layer, the plurality of light-transmitting areas represents at least a character, a symbol or the image. Therefore, light 608, generated from the LCD module 101a of the display 101 and transmitted through the touch panel 101b and the cover glass 101c of the display 101, may transmit through the cover portion 220 via the apertures 605, 606 on the first and second layer 601, 603 and the transparent layer 602. The plurality of the first and second apertures 605, 606 with the portion of a transparent layer 602 which the light 608 transmitted through forms the plurality of the light-transmitting areas 220a.

Referring to FIG. 14, an opaque or non-transparent layer 604 may be disposed between the first layer 601 and the transparent layer 602, and another opaque or non-transparent layer 604 may be also disposed between the transparent layer 602 and the second layer 603. Each of the opaque or non-transparent layers 604 has a plurality of third apertures 604a, such as openings, cavities, windows or holes, corresponding to the plurality of the first apertures 605. Each of the plurality of third apertures 604a of the opaque or non-transparent layers 604 corresponds to one of the plurality of first apertures 606 of the second layer 603. In another embodiment not shown, the upper or lower one of the opaque or non-transparent layer 604 may be omitted.

Referring to FIG. 14, a third layer 607 may be disposed on the first layer 601 or on the first layer 601 and the plurality of first apertures 605 and the transparent layer 602. The third layer is disposed on the first layer so that the fraction generated between an object and the first layer is reduced. In turn, the third layer generates less fraction then the first layer when an object is pressed against it. The third layer 607 has lubricity, and is disposed on the surface area of the transparent layer 602 corresponding the plurality of the first apertures 605. The third layer 607 may be a lubricant which made out of material that is non-sticking or low coefficients of friction against solid, for example the third layer 607 may be Polytetrafluoroethylene (PTFE), fluoropolymer, fluorocarbon or Teflon. When the cover portion 220 placed or disposed above the electronic device 100, the second layer 603 faces toward the electronic device 100. The image, text or number which is generated by the display 101 of the electronic device 100 projects through the cover portion 220 via the plurality of the second apertures 606 of the second layer 603, the transparent layer 602 and the plurality of the first apertures 605 of the first layer 601. The display 101 may include the LCD module 101a, the cover glass 101b, and the touch panel 101c4, all of which are stacking in order to have function of display image and sense user touch on the LCD module 101a or the touch panel 101b.

Referring to FIGS. 2 and 15, the transparent layer 602 may be a light guide, diffuser, or polarizer and it may be semi-transparent or doped with material to interference with the light transmitting though. The transparent layer 602 may be electrically controlled to change the transparency of the material. The transparent layer 602 may further comprise at least one cavity 611, such as a dint, dip, hole, through hole or cut. The first element 612 such as magnet, permanent magnet, electronic magnet or material or component that can produces a magnetic or electric field may be placed or disposed in the cavity 611. The first layer 601 and second layer 603 may be disposed to cover the first element 612. The first element 612 such as magnet has polarity and the electronic device 100 may identify the accessory 200 based on the polarity of the magnet by using the sensor 124 to sense the polarity of the magnet. For example, when the first element 612 generates a first magnetic field in a first direction toward the sensor 124, the sensor 124 senses the magnetic field is in the first direction and the process unit of the electronic device 100 determines the covering portion 220 disposed on the electronic device 100 has the plurality of light-transmitting areas 220a and the image displayed is changed to incorporate with the cover. When the first element 612 generates a second magnetic field in a second direction toward the sensor 124 and the sensor 124 senses the magnetic field is in the second direction, the process unit of the electronic device 100 determines the covering portion 220 disposed on the electronic device 100 is a standard non-transparent or non-light transmitting cover and the display 101 is disable or not display any image.

Figure 16:
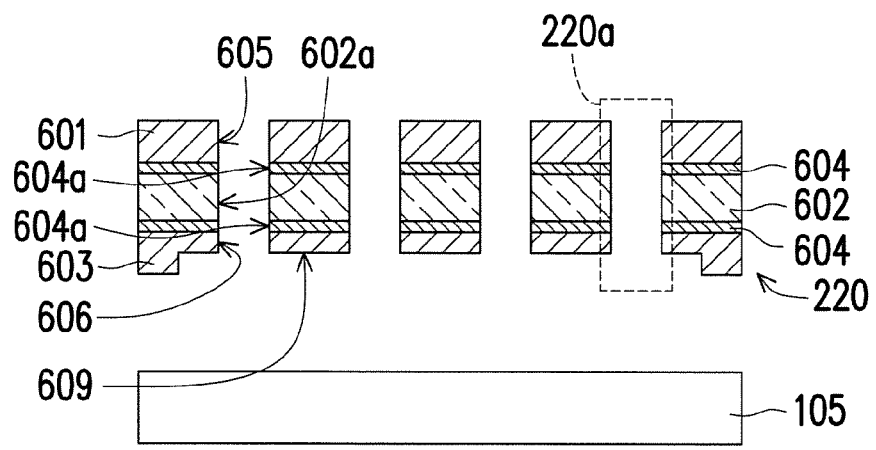
FIG. 16 is a cross-sectional view of the cover portion of the accessory and the electronic device in FIG. 13 taken along line III-III.

Referring to FIG. 16, the electronic device 100 may further comprise at least one speaker 105. The speaker 105 is placed or disposed adjacent or in close proximity to the display 101 of the electronic device 100. The cover portion 220 may be disposed or covers the speaker 105 and/or surrounding area. The portion of the cover portion 220 which covers the speaker 105 and/or surrounding area has a plurality of first through holes 602a. The sound or voice generated by the speaker 105 may be transmitted through the first through holes 602a and toward the outside environment of the accessory 200. In turns of three layers structure, the transparent layer 602 has a plurality of first through holes 602a corresponding to the position of the speaker 105 of the electronic device 100 and/or the surrounding area of the speaker 105. The first layer 601 disposed on one side of the transparent layer 602 and the second layer 603 disposed on the other side of the transparent layer 602 around the portion of the cover portion 220 which covers the speaker 105 and/or surrounding area. The first layer 601 has a plurality of first apertures 605, such as openings, cavities, windows or holes. The second layer 603 has a plurality of second apertures 606, such as openings, cavities, windows or holes. Each of the plurality of first through holes 602a corresponds to one of the plurality of second apertures 606 of the second layer 603 and one of the plurality of first apertures 605 of the first layer 601. Therefore, sound or voice may transmit through the cover portion 220 via the apertures 605, 606 on the first and second layer 601, 603 and the first through holes 602a of the transparent layer 602. The second layer 603 may have a depression 609 such as dip, embrasure, cavity or sink around the close proximity of the speaker 105 and/or surrounding area. The depression 609 forms a chamber or spacing between the second layer 603 and the speaker when the cover portion 220a is disposed or covering the speaker 105.

The sound of the speaker 105 may be produced more efficiently and transmits more efficiently through the cover portion 220 and be resonated in the spacing to produce better sound quality.

Figure 17:
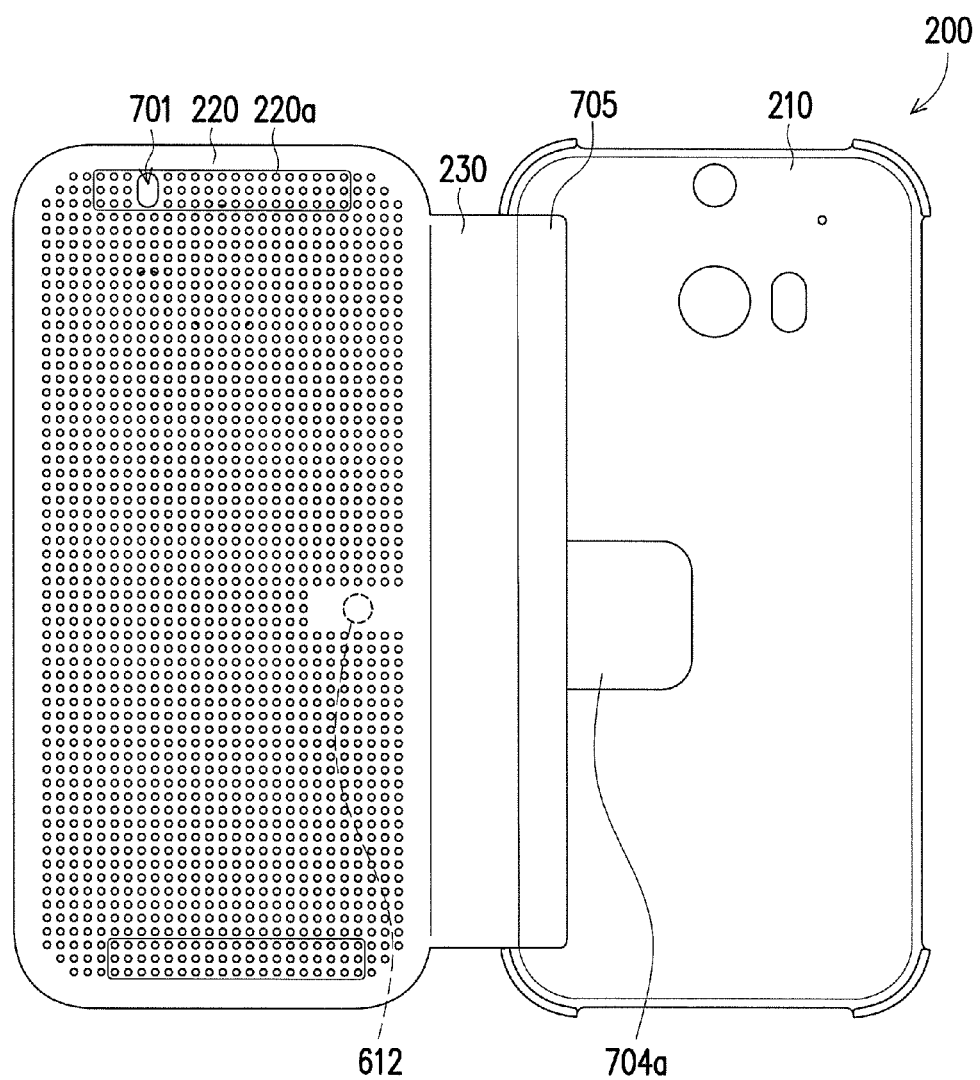
FIG. 17 is a front view of the accessory in FIG. 13 with the cover portion opened.

Referring to FIGS. 13 and 17, the electronic device 100 may further comprise at least one distance sensor 108. The distance sensor 108 may be a proximity sensor, light sensor, IR sensor or ultrasonic sensor. The distance sensor 108 is placed or disposed adjacent or in close proximity to the display 101 of the electronic device 100. The cover portion 220 may be disposed or over the distance sensor 108 and/or surrounding area. The portion of the cover portion 220 which over the distance sensor 108 and/or surrounding area has a second through hole 701. The light, inferred light, ultrasound generated by the distance sensor 108 may be transmitted through the second through hole 701 and toward the outside environment of the accessory 200. The second through hole 701 may be form by the first layer 601 only corresponding the position of the distance sensor 108. The second through hole 701 may incorporate with the three layers structure, the transparent layer 602 has the second through hole 701 corresponding to the position of the distance sensor 108 of the electronic device 100 and/or the surrounding area of the distance sensor 108. The first layer 601 disposed on one side of the transparent layer 602 and the second layer 603 disposed on the other side of the transparent layer 602 around the portion of the cover portion 220 which covers the distance sensor 108 and/or surrounding area. Referring to FIGS. 13, 16 and 17, the first layer 601 has a plurality of first apertures 605, such as openings, cavities, windows or holes. The second layer 603 has a plurality of second apertures 606, such as openings, cavities, windows or holes. Each of the plurality of the second through holes 701 corresponds to one of the plurality of second apertures 606 of the second layer 603 and one of the plurality of first apertures 605 of the first layer 601. Therefore, ultrasound or infrared may transmit through the cover portion 220 via the apertures 605, 606 on the first and second layer 601, 603 and the through hole 602a of the transparent layer 602.

Referring to FIGS. 13, 15 and 17, the position of the first element 612 may be placed or disposed close to the flexible portion 230. The sensor 124 of the electronic device 100 may be placed or disposed close to the flexible portion 230 to sense the first element 612 when the cover portion 220 is moved from a first position to second position, such as a close position in FIG. 13 to an open position in FIG. 17. When the cover portion 220 is moved, the displacement of the cover portion 220 is low at the side with the flexible portion 230 compare with opposite side of the cover portion 220 that is away from the flexible portion 230. So, by placing the first element 612 close to the flexible portion 230, the possible of detection error due to accidental movement of the cover portion 220 can be reduced.

The coupling portion 210 may further comprise a second element 704a placed or disposed close to the flexible portion 230. The second element is disposed on the coupling portion corresponding to the position of the first sensor, and the first sensor does not detect the first element with the second element between the first sensor and the first element. The second element 704a may be any ferromagnetic metal. That is, anything containing iron, nickel or cobalt. The second element 704a act as a magnetic shield and it shield the sensor 124 from the magnetic field from the back side of the coupling portion 210. The cover portion 220 may be flip to the back side of the coupling portion 210 by twisting or turning the flexible portion 230. The second element 704a may be interfering with detection of the sensor 124 from the back side of the coupling portion 210. By placing the second element 704a on the coupling portion 210 in the place corresponding to the position of the sensor 124 on the coupling portion 210, the second element 704a shields the sensor 124 from the magnetic field generated by the first element 612.

Figure 18:
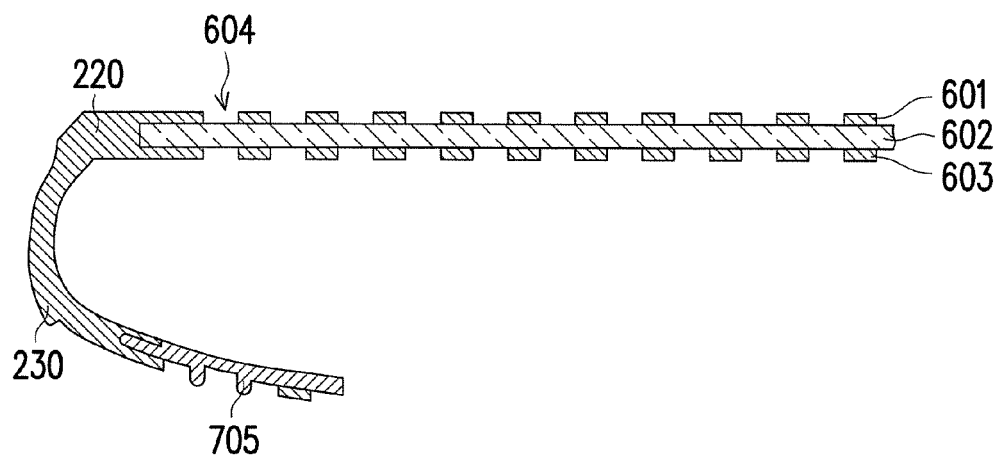
FIG. 18 is a cross-sectional view of the cover portion and the flexible portion in FIG. 13 taken along line IV-IV.
Figure 19:
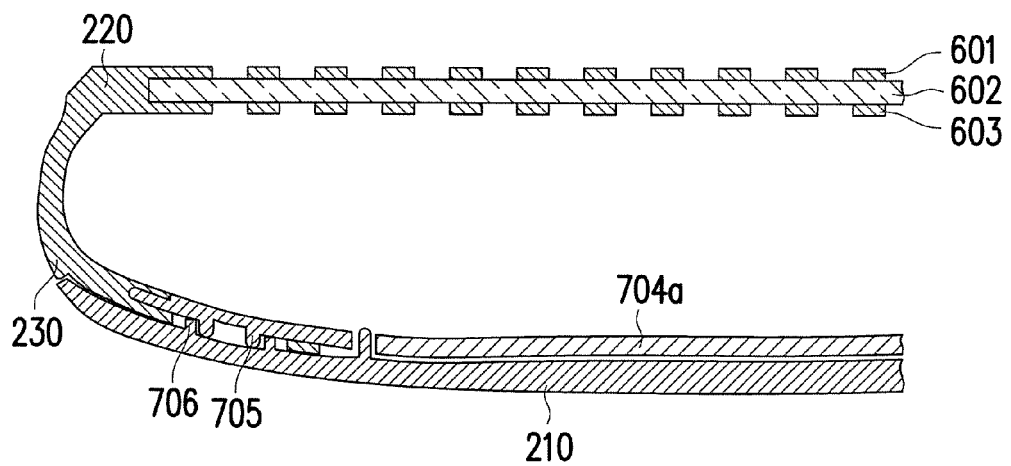
FIG. 19 is a cross-sectional view of the accessory in FIG. 13 taken along line IV-IV.

Please refer to FIGS. 17, 18 and 19 for the cross section of the cover portion 220 and flexible portion 230. The flexible portion 230 has a first secure component 705. The first secure component 705 is bond to the coupling portion 210. The coupling portion 210 has a second secure component 706. The first secure component 705 and the second secure component 706 may be coupled together through the use of ultrasonic bonding. The cover portion 220 and the flexible portion 230 may be formed as one piece with the transparent layer 602 and/or non-transparent layer 604 shown in FIG. 14.

Figure 20:
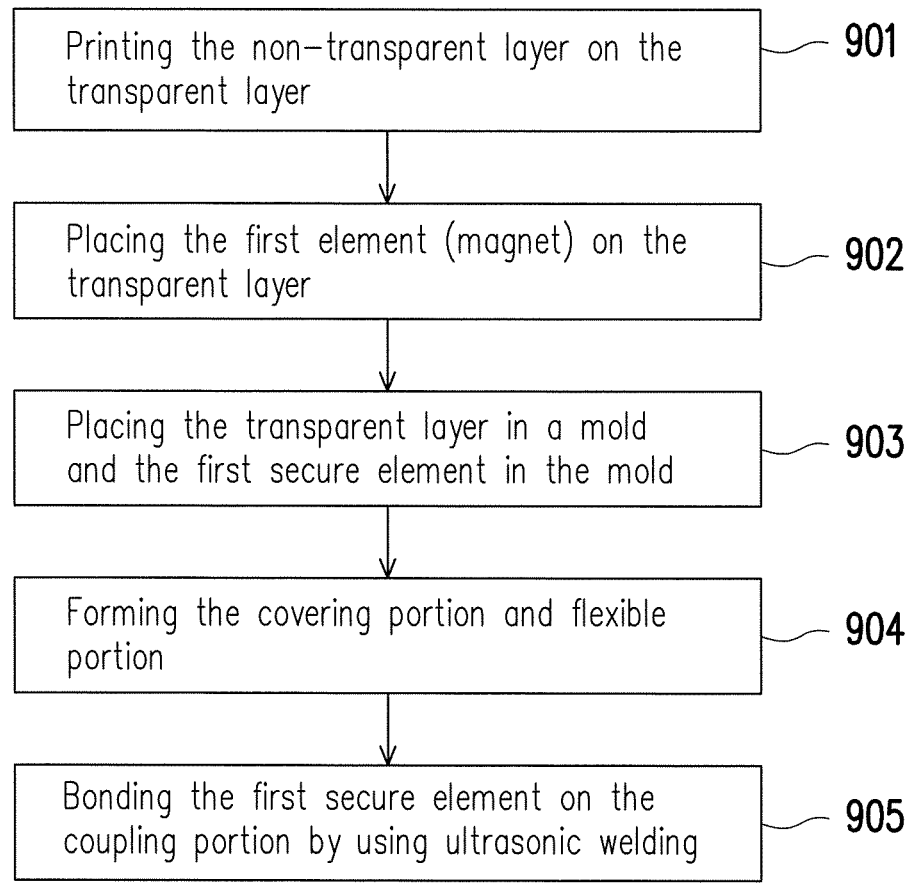
FIG. 20 is a flow chart of a method for forming an accessory of another embodiment of the application.

The method of forming the accessory 200 including the coupling portion 210, the cover portion 220 and the flexible portion 230 is described in FIG. 20. The first process 901 is printing the non-transparent layer on the transparent layer. The second process 902 is placing the first element (such as a magnet) on the transparent layer. Next process 903 is placing the transparent layer in a mold and the first secure element in the mold. The next process 904 is forming the covering portion and flexible portion. Finally, the next process 905 is placing the flexible portion with the first secure element on the coupling portion together and bond the first secure element on the coupling portion by using ultrasonic welding. Each process is further illustrated as following.

Figure 21:
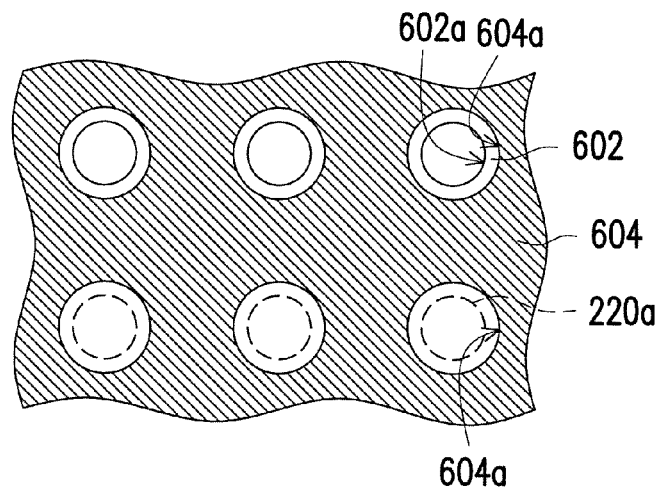
FIG. 21 is a schematic view of the layout of the non-transparent layer on the transparent layer, disclosed in FIG. 20.
Figure 22:
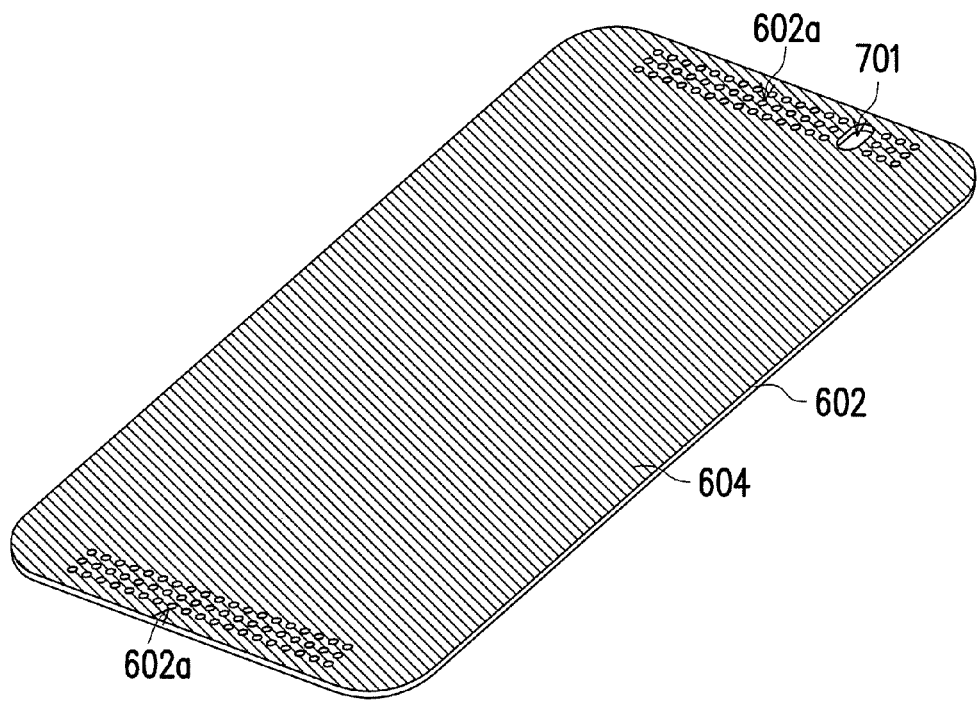
FIG. 22 is a front perspective view of the transparent layer with the non-transparent layer thereon, disclosed in FIG. 20.

Referring to FIGS. 21 and 22, in the process (901 in FIG. 20), the first step is to have the transparent layer 602. The transparent layer 602 may be transparent PCB or transparent board. Next, a non-transparent layer 604 such as color ink is printed on the transparent layer 602. The non-transparent layer 604 surrounds the light-transmitting areas 220a, and surrounds the first through holes 602a that are formed later or earlier. The color ink may be any ink that is non-transparent to the light. This process is to decrease the light transmittance of the area having the color printing. Next, the first through holes 602a and the second through hole 701 are made on the transparent layer 602. The step of printing of the ink on the transparent layer 602 to form the non-transparent layer 604 and the step of making of the first through holes 602a and the second through hole 701 may be changed. The process may be first making the first through holes 602a and the second through hole 701 on the transparent layer 602 and then printing ink on the transparent layer 602 to form the non-transparent layer 604.

Figure 23:
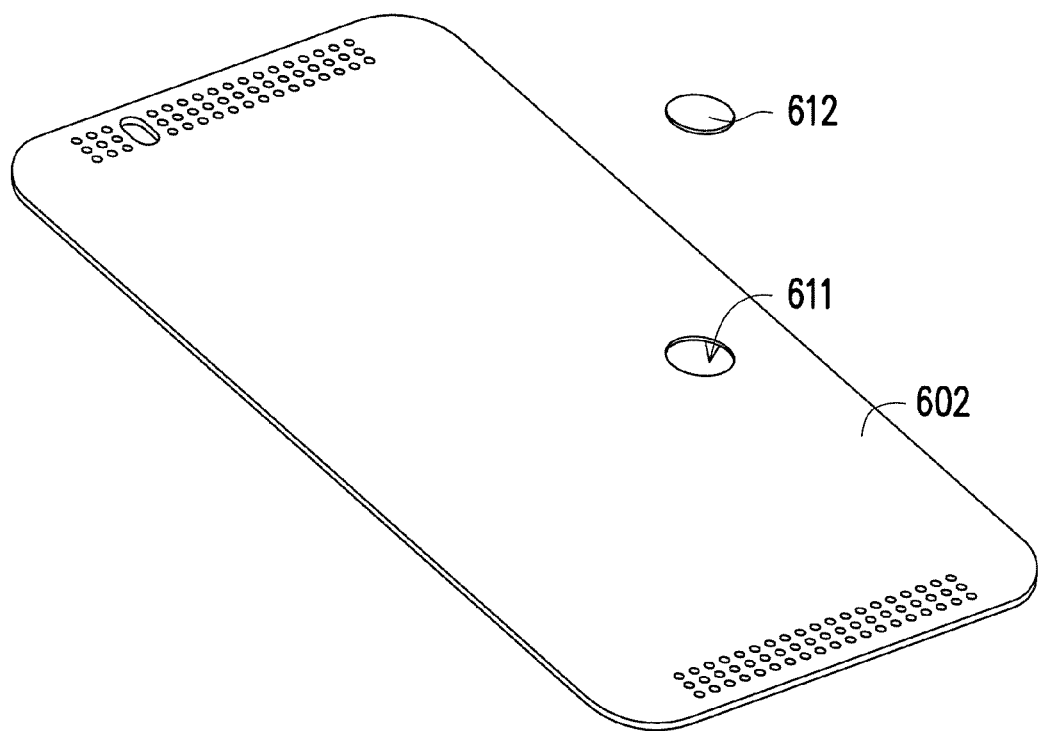
FIG. 23 is a rear perspective view of the transparent layer and the first element, disclosed in FIG. 20.

Referring to FIG. 23, in the next process (902 in FIG. 20), the first element 612 is placed in the cavity 611 of the transparent layer 602. The first element 612 may have the same color as the color ink printed on the transparent layer 602. In one embodiment, color ink may be printed on both the transparent layer 602 and the first element 612 at once. Therefore, the non-transparent layer 604 by ink printing may be formed on the first element 612 and the side of the transparent layer 602 where the first element 612 is placed.

Figure 24:
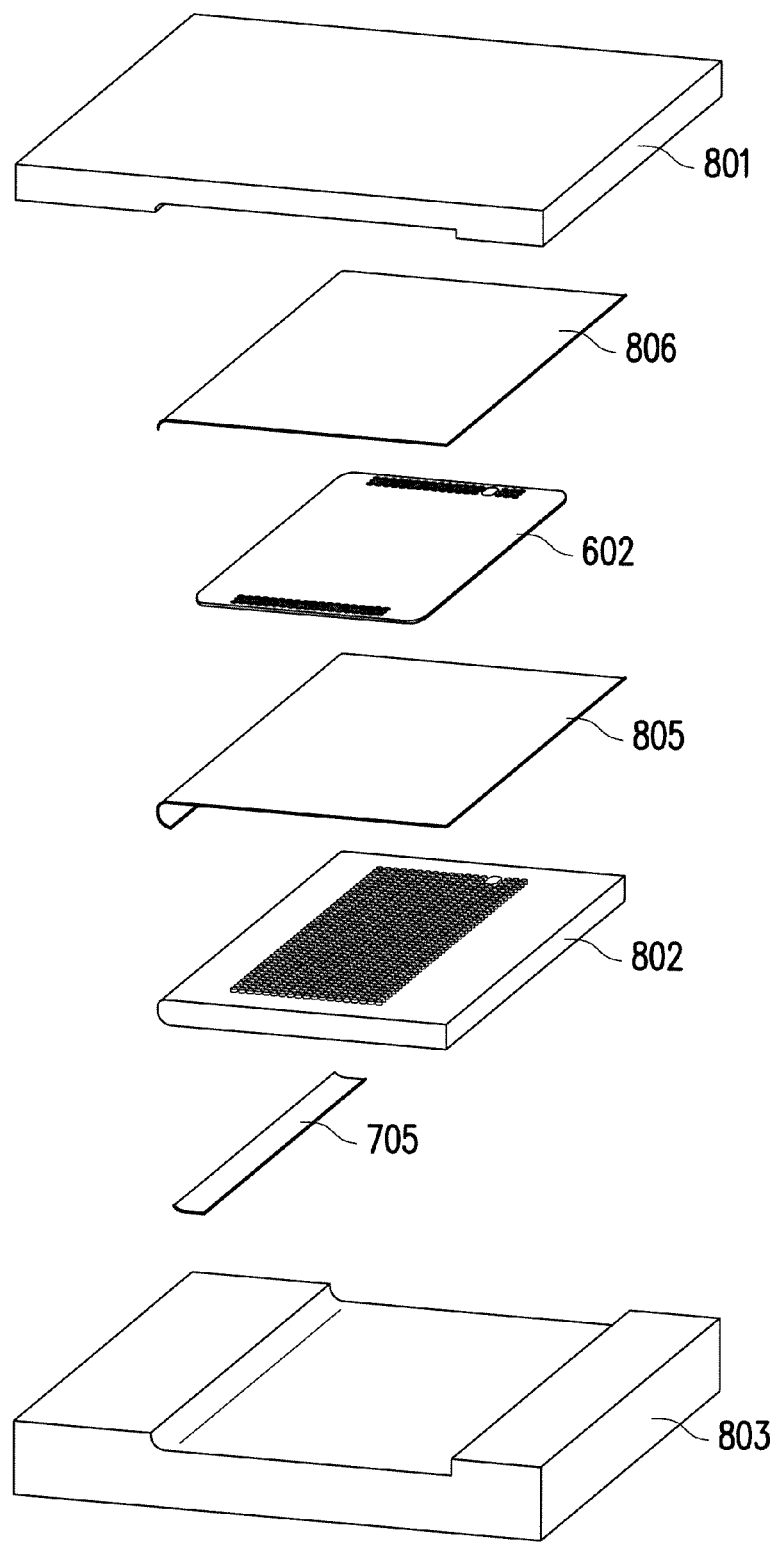
FIG. 24 is an exploded view of the mold, the transparent layer in FIG. 20 and the materials.
Figure 25:
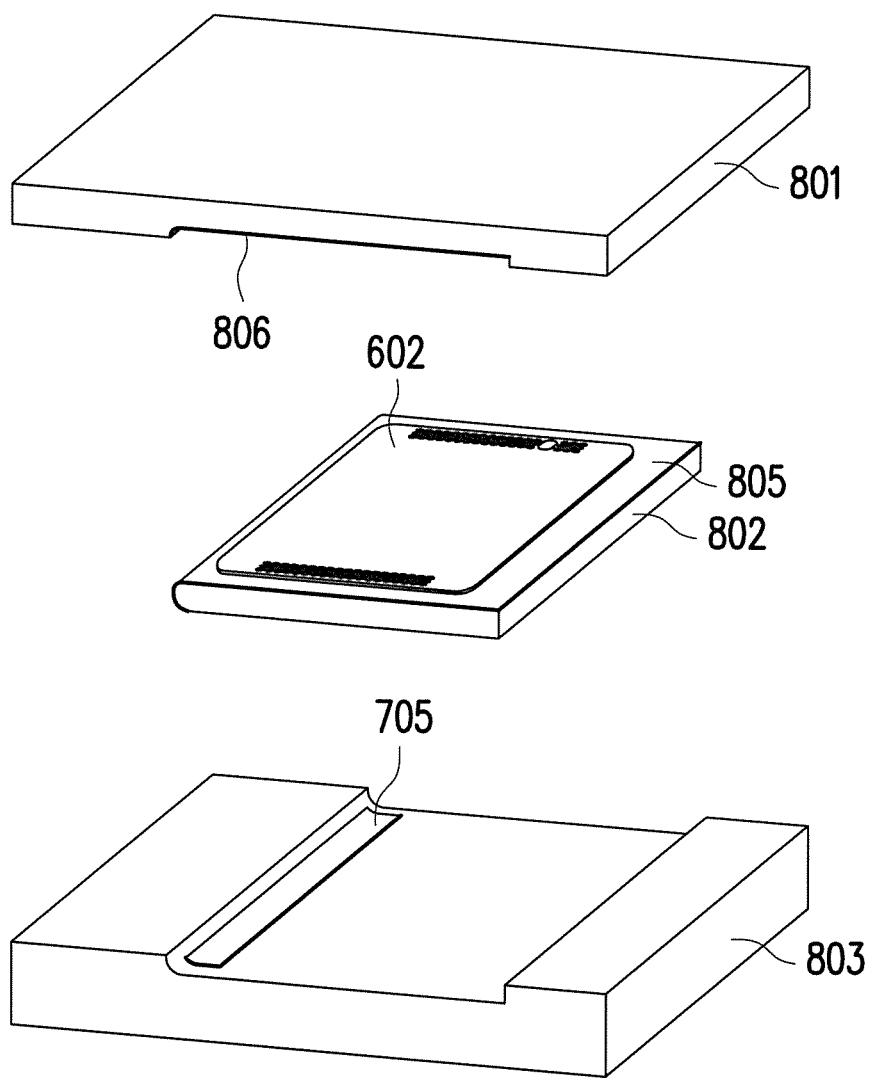
FIG. 25 is another explodes view of the mold, the transparent layer and the materials with some grouped together.

Referring to FIGS. 24 and 25, in the next process (903 in FIG. 20), the transparent layer 602 (such as a transparent PCB or a transparent board) is placed in the mold. The mold may be casting mold and have three molding pieces, including an upper molding piece 801 (male die), a middle molding piece 802 (mold core), and a bottom molding piece 803 (female die). A first material 805 is placed or disposed on the middle molding piece 802, and a second material 806 is placed or disposed on the bottom of the upper molding piece 801 which has an air suction to keep the second material 806 on the bottom of the upper molding piece 801. Next, the transparent layer 602 is placed in the middle molding piece 802 and/or on the first material 805. The first secure component 705, also as disclosed in FIG. 18, is placed on the bottom molding piece 802. In one embodiment, the first and second materials 805, 806 may be rubber, such as silicon rubber, while the first secure component 705 may be made of plastic. Regardless of the material, the elasticity of the first and second materials 805, 806 is larger than the elasticity of the first secure component 705.

Figure 26:
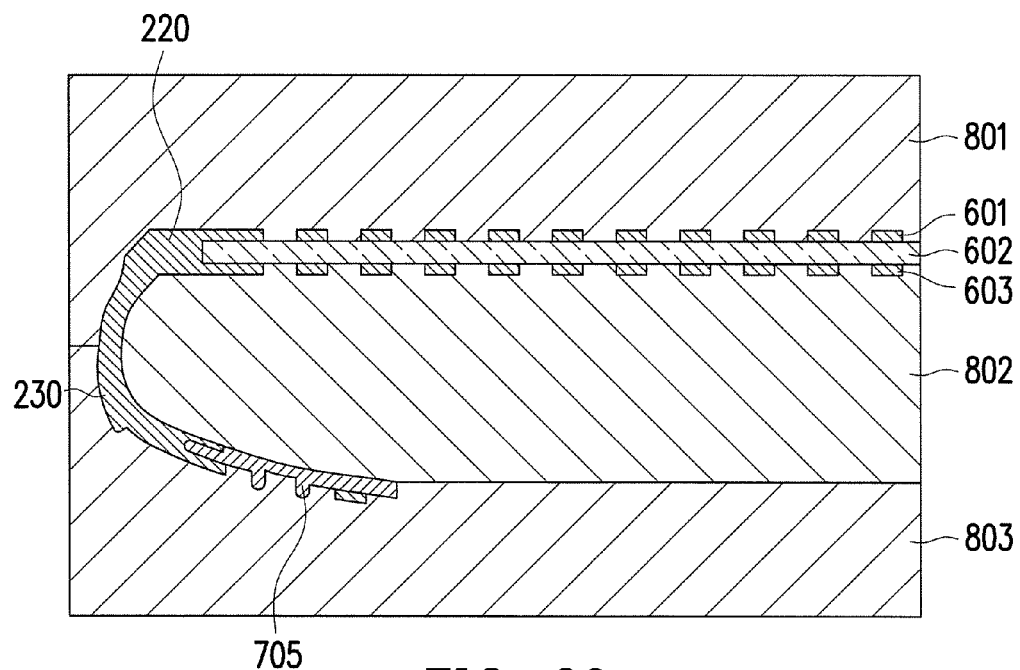
FIG. 26 is a cross-sectional view of the mold, the transparent layer and the materials after forming the covering portion and the flexible portion.

Next referring to FIGS. 18, 25 and 26, in the next process (904 in FIG. 20), the mold is closed and having the middle molding piece 802 enclosed by the upper and bottom molding pieces 801, 802. The first and second materials 805, 806 may be heated to form the flexible portion 230, the first layer 601 and second layer 603 as one piece. The first and second materials 805, 806 may be heated and flow in to the space in the mold, between the upper molding pieces 801, the middle molding piece 802 and the bottom molding piece 803. The first and second materials 805, 806 may flow down toward the space between the bottom molding piece 803 and middle piece 802 and attached to the first secure component 705. The mold is opened so that the piece formed in the mold is taken out, and thus the covering portion 220 and the flexible portion 230 is formed as one piece as disclosed in FIG. 18.

Figure 27:
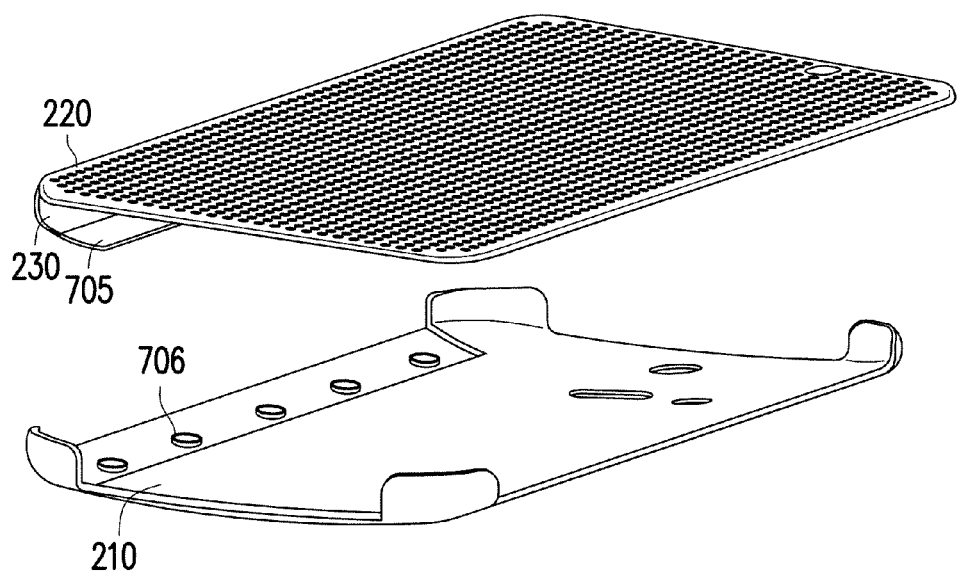
FIG. 27 is a perspective view of the covering portion, the flexible portion and the coupling portion before the flexible portion being attached to the coupling portion.

Next referring FIG. 27, in the next process (905 in FIG. 20), the flexible portion 230 is attached to the coupling portion 210. The coupling portion 210 has the second secure component 706. The first secure component 705 is placed on the second secure component 706 and is processed with ultrasonic process such as ultrasonic welding to heat and bond the first secure component 705 and the second secure component 706 together. In one embodiment, the first and second secure components 705, 706 may be made of the same or similar material which facilitates the ultrasonic bonding. In one embodiment, the second element 704a may be placed on the coupling portion 210 as disclosed in FIG. 19 to provide shield of magnetic field for the sensor 124.

Although the application has been described with reference to the above embodiments, it will be apparent to one of the ordinary skill in the art that modifications and variations to the described embodiments may be made without departing from the spirit and scope of the application. Accordingly, the scope of the application will be defined by the attached claims not by the above detailed descriptions.

What is claimed is:

1. A protective cover covering an electronic device, wherein the electronic device has a display area and the protective cover comprises:
a coupling portion coupled to the electronic device; and
a cover portion coupled to the coupling portion, the cover portion being flipped, rotating with respect to the coupling portion, to cover the display area of the electronic device, and the cover portion including:
a transparent layer,
a first layer disposed on one side of the transparent layer and having a plurality of first apertures; and
a second layer disposed on the other side of the transparent layer and having a plurality of second apertures, each of the plurality of first apertures of the first layer corresponds to one of the plurality of second apertures of the second layer, wherein the plurality of the first and second apertures with the transparent layer form a plurality of light-transmitting areas, wherein the plurality of light transmitting areas are arranged in an array, wherein when the cover portion covers the display area, an image is displayed by the display area, wherein the first image displayed by the display area contains a plurality of discrete blocks each of the plurality of blocks corresponds to one of the plurality of light transmitting areas, and each of the blocks contains a plurality of pixels, and the image is projected out of the corresponding light transmitting areas as a projected image forming a dotted character, a dotted symbol, or a dotted pattern.

2. The protective cover as claimed in claim 1, wherein the cover portion further comprises a non-transparent layer disposed between the first layer and the transparent layer.

3. The protective cover as claimed in claim 1, wherein the cover portion further comprises a non-transparent layer disposed between the transparent layer and the second layer.

4. The protective cover as claimed in claim 1, wherein the cover portion further comprises a third layer disposed on the first layer so that fraction generated between an object and the third layer is less than friction generated between the object and the first layer.

5. The protective cover as claimed in claim 1, wherein the electronic device comprises a speaker disposed adjacent or in close proximity to the display area, and the cover portion has a plurality of first through holes corresponding to the position of the speaker and/or the surrounding area of the speaker.

6. The protective cover as claimed in claim 1, wherein the electronic device comprises a speaker disposed adjacent or in close proximity to the display area, and the transparent layer has a plurality of third apertures and each of the plurality of third apertures corresponds to one of the plurality of first apertures to the position of the speaker and/or the surrounding area of the speaker.

7. The protective cover as claimed in claim 1, wherein the electronic device comprises a display and a speaker placed or disposed adjacent or in close proximity to the display area, and the second layer has a depression, and the depression forms a chamber or spacing between the second layer and the speaker.

8. The protective cover as claimed in claim 1, wherein the electronic device has a first sensor and the cover portion has a first element, and when the cover portion covers the display area, the first sensor senses the first element in proximity with the electronic device.

9. The protective cover as claimed in claim 1, wherein the electronic device has a plurality of first sensors and the cover portion has a plurality of first elements, and when the plurality of first elements generates a first combination of magnetic field, the plurality of first sensors senses the first combination of magnetic field generated by the plurality of the first elements.

10. The protective cover as claimed in claim 8, wherein the first element is disposed on the transparent layer.

11. The protective cover as claimed in claim 8, further comprises a flexible portion having a first secure component and the coupling portion having a second secure component, the coupling portion coupled to the electronic device, the cover portion connected to the coupling portion wherein the first secure component is bonded to the second secure component.

12. The protective cover as claimed in claim 11, wherein the cover portion and the flexible portion are formed as one piece.

13. The protective cover as claimed in claim 11, wherein the coupling portion further comprise a second element disposed on the coupling portion corresponding to the position of the first sensor, and the first sensor does not detect the first element with the second element between the first sensor and the first element.

14. The protective cover as claimed in claim 1, wherein a minimum width of each of the blocks is greater than the maximum width of each of the corresponding light-transmitting areas.

15. The protective cover as claimed in claim 1, wherein a minimum width of each of the blocks is greater than a shortest distance between any two adjacent light-transmitting areas.

16. The protective cover as claimed in claim 1, further comprises a flexible portion, wherein the flexible portion connects between the cover portion and the coupling portion, wherein a location of the cover portion relative to the coupling portion is changed by bending the flexible portion to decide whether the cover portion covers the display area of the electronic device.

17. The protective cover as claimed in claim 16, wherein the cover portion has a first element and the first element disposed adjacent to the flexible portion.

18. The protective cover as claimed in claim 16, wherein the coupling portion is concave and structurally covers the electronic device to fix a location of the coupling portion relative to the electronic device.

19. The protective cover as claimed in claim 16, wherein the electronic device has a first magnetic coupling member and the coupling portion has second magnetic coupling member, wherein the first magnetic coupling member and the second magnetic coupling member are suitable to be magnetically attracted to each other to fix a location of the coupling portion relative to the electronic device.

20. The protective cover as claimed in claim 1, wherein the electronic device has a sensor for detecting a presence of nearby objects, and the cover portion has an opening for the sensor to detect the presence of nearby objects via the opening of the cover portion.

* * * * *